(12) United States Patent
Inoue et al.

(10) Patent No.: US 11,309,861 B2
(45) Date of Patent: Apr. 19, 2022

(54) GUIDED SURFACE ACOUSTIC WAVE DEVICE PROVIDING SPURIOUS MODE REJECTION

(71) Applicant: TriQuint Semiconductor, Inc., Hillsboro, OR (US)

(72) Inventors: Shogo Inoue, Longwood, FL (US); Marc Solal, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 252 days.

(21) Appl. No.: 16/130,433

(22) Filed: Sep. 13, 2018

(65) Prior Publication Data

US 2019/0013791 A1    Jan. 10, 2019

Related U.S. Application Data

(63) Continuation of application No. 15/086,936, filed on Mar. 31, 2016, now Pat. No. 10,128,814.
(Continued)

(51) Int. Cl.
*H03H 9/02* (2006.01)
*H03H 9/13* (2006.01)
(Continued)

(52) U.S. Cl.
CPC .... *H03H 9/02818* (2013.01); *H03H 9/02543* (2013.01); *H03H 9/02574* (2013.01);
(Continued)

(58) Field of Classification Search
CPC ................ H03H 9/02818; H03H 9/02543
See application file for complete search history.

(56) References Cited

U.S. PATENT DOCUMENTS

| 4,600,853 A | 7/1986 | Whitlock et al. |
| 5,441,900 A | 8/1995 | Bulucea et al. |
| (Continued) |

FOREIGN PATENT DOCUMENTS

| EP | 2490333 A1 | 8/2012 |
| EP | 2658123 A1 | 10/2013 |
| (Continued) |

OTHER PUBLICATIONS

Corrected Notice of Allowability for U.S. Appl. No. 15/087,225, dated Jan. 28, 2020, 4 pages.
(Continued)

*Primary Examiner* — Shawki S Ismail
*Assistant Examiner* — Karen B Addison
(74) *Attorney, Agent, or Firm* — Withrow & Terranova, P.L.L.C.

(57) ABSTRACT

Embodiments of a Surface Acoustic Wave (SAW) device having a guided SAW structure that provides spurious mode suppression and methods of fabrication thereof are disclosed. In some embodiments, a SAW device includes a non-semiconductor support substrate, a piezoelectric layer on a surface of the non-semiconductor support substrate, and at least one interdigitated transducer on a surface of the piezoelectric layer opposite the non-semiconductor support substrate. A thickness of the piezoelectric layer, a SAW velocity of the piezoelectric layer, and an acoustic velocity of the non-semiconductor support substrate are such that a frequency of spurious modes above a resonance frequency of the SAW device is above a bulk wave cut-off frequency of the SAW device. In this manner, the spurious modes above the resonance frequency of the SAW device are suppressed.

29 Claims, 26 Drawing Sheets

Related U.S. Application Data

(60) Provisional application No. 62/288,244, filed on Jan. 28, 2016.

(51) Int. Cl.
*H03H 9/145* (2006.01)
*H03H 9/64* (2006.01)

(52) U.S. Cl.
CPC ........ *H03H 9/02787* (2013.01); *H03H 9/131* (2013.01); *H03H 9/14564* (2013.01); *H03H 9/6406* (2013.01); *H03H 9/02834* (2013.01)

(56) References Cited

U.S. PATENT DOCUMENTS

| | | | |
|---|---|---|---|
| 5,446,330 | A | 8/1995 | Eda et al. |
| 5,475,348 | A | 12/1995 | Hode et al. |
| 5,719,538 | A | 2/1998 | Kadota |
| 6,344,705 | B1 | 2/2002 | Solal et al. |
| 6,445,265 | B1 | 9/2002 | Wright |
| 6,710,509 | B1 | 3/2004 | Kadota |
| 7,105,980 | B2 | 9/2006 | Abbott et al. |
| 7,411,333 | B2 | 8/2008 | Kihara et al. |
| 8,035,464 | B1 | 10/2011 | Abbott et al. |
| 8,115,365 | B2 * | 2/2012 | Suzuki ............... H03H 3/10 310/313 R |
| 8,456,257 | B1 * | 6/2013 | Fattinger ............ H03H 9/02118 333/187 |
| 9,319,023 | B2 * | 4/2016 | Tanaka ............... H03H 9/1071 |
| 9,438,201 | B2 | 9/2016 | Hori et al. |
| 9,503,049 | B2 * | 11/2016 | Little ............... H03H 9/14541 |
| 10,084,427 | B2 | 9/2018 | Solal et al. |
| 2007/0296306 | A1 | 12/2007 | Hauser et al. |
| 2008/0252394 | A1 | 10/2008 | Tajima et al. |
| 2009/0096046 | A1 | 4/2009 | Heringa et al. |
| 2009/0236935 | A1 | 9/2009 | Kando |
| 2010/0141086 | A1 | 6/2010 | Suzuki et al. |
| 2010/0289379 | A1 | 11/2010 | Owaki et al. |
| 2012/0032759 | A1 | 2/2012 | Nishii et al. |
| 2012/0038435 | A1 | 2/2012 | Yata et al. |
| 2013/0049533 | A1 | 2/2013 | Matsuda et al. |
| 2013/0207747 | A1 | 8/2013 | Nishii et al. |
| 2013/0285768 | A1 | 10/2013 | Watanabe et al. |
| 2014/0145557 | A1 | 5/2014 | Tanaka |
| 2014/0152146 | A1 | 6/2014 | Kimura et al. |
| 2014/0167565 | A1 | 6/2014 | Iwamoto |
| 2014/0210317 | A1 | 7/2014 | Tai et al. |
| 2015/0069882 | A1 | 3/2015 | Umeda et al. |
| 2015/0102705 | A1 | 4/2015 | Iwamoto et al. |
| 2016/0380611 | A1 | 12/2016 | Kai |
| 2017/0033756 | A1 | 2/2017 | Inoue et al. |
| 2017/0033764 | A1 | 2/2017 | Inoue et al. |
| 2017/0222618 | A1 | 8/2017 | Inoue et al. |
| 2017/0222622 | A1 | 8/2017 | Solal et al. |
| 2018/0102760 | A1 | 4/2018 | Inoue et al. |
| 2018/0109241 | A1 | 4/2018 | Inoue et al. |
| 2018/0109242 | A1 | 4/2018 | Solal et al. |
| 2018/0159495 | A1 | 6/2018 | Inoue et al. |
| 2018/0337654 | A1 | 11/2018 | Solal et al. |

FOREIGN PATENT DOCUMENTS

| | | |
|---|---|---|
| FR | 2788176 A1 | 7/2000 |
| JP | H06326553 A | 11/1994 |
| JP | 2002076835 A | 3/2002 |
| JP | 2006319679 A | 11/2006 |
| JP | 2007028538 A | 2/2007 |
| JP | 2015073331 A | 4/2015 |
| JP | 5713025 B2 | 5/2015 |
| WO | 2008078481 A1 | 7/2008 |
| WO | 2010004741 A1 | 1/2010 |
| WO | 2011037145 A1 | 9/2010 |
| WO | 2010125934 A1 | 11/2010 |
| WO | 2011046117 A1 | 4/2011 |
| WO | 2012086639 A1 | 6/2012 |
| WO | 2013172251 A1 | 11/2013 |
| WO | 2017132183 A1 | 8/2017 |
| WO | 2017132184 A1 | 8/2017 |

OTHER PUBLICATIONS

Non-Final Office Action for U.S. Appl. No. 15/087,225, dated Feb. 8, 2019, 9 pages.
Final Office Action for U.S. Appl. No. 15/087,423, dated Jan. 18, 2019, 14 pages.
Non-Final Office Action for U.S. Appl. No. 16/048,520, dated Mar. 5, 2019, 5 pages.
Extended European Search Report for European Patent Application No. 18196819.9, dated Mar. 1, 2019, 12 pages.
Author Unknown, "What is Saw Filters: Advantage of Token Piezoelectric Saw Devices," Token, Version 2010, 5 pages.
Author Unknown, "Working principles and Applications of SAW/FBAR Devices," TaiyoYuden, Navigator, Section 2, Aug. 11, 2014, pp. 10-15.
Chen, Jing et al., "Suppression Rayleigh Wave Spurious Signal in SH-SAW Devices Employing PMN-33%PT crystals," Proceedings of Symposium on Ultrasonic Electronics, vol. 31, Issue 2010, Dec. 6-8, 2010, pp. 287-288.
Emam, Mostafa, "RF SOI: from Material to ICs—an Innovative Characterization Approach," FD-SOI and RF-SOI Forum, Feb. 27, 2015, 35 pages.
Gong Songbin et al., "Overmoded Shear Horizontal Wave MEMS Resonators using X-Cut Lithium Niobate Thin Film," 2014 IEEE International Ultrasonics Symposium (IUS), Sep. 3-6, 2014, pp. 568-571.
Kadota, Michio, et al., "Improved Quality Factor of Hetero Acoustic Layer (HAL) SAW Resonator Combining LiTaO3 Thin Plate and Quartz Substrate," International Ultrasonics Symposium, Washington, DC, Sep. 6-9, 2017, IEEE, 4 pages.
Hayashi, Junki!, et al., "High Coupling and Highly Stable Leaky Saws on LiTaO3 Thin Plate Bonded to Quartz Substrate," Proceedings of Symposium on Ultrasonic Electronics, vol. 38, Oct. 2017, IEEE, 2 pages.
Malocha, Donald C., "Surface Acoustic Wave Technology and Wireless Applications," Presentation at the University of South Florida, Nov. 14, 2001, 145 pages.
Miura, M. et al., "Temperature Compensated LiTaO3/Sapphire Bonded Saw Substrate with low Loss and High Coupling Factor Suitable for US-PCS Application," 2004 IEEE Ultrasonics Symposium, vol. 2, Aug. 23-27, 2004, pp. 1322-1325.
Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.
Reinhardt, Alexandre et al., "Acoustic filters based on thin single crystal LiNbO$_3$ films: Status and prospects," 2014 IEEE International Ultrasonics Symposium (IUS), Sep. 3-6, 2014, pp. 773-781.
Solal, M. et al., "Oriented lithium niobate layers transferred on 4" (100) silicon wafer for RF SAW devices," Proceedings of the 2002 IEEE Ultrasonics Symposium, vol. 1, Oct. 2002, IEEE, pp. 131-134.
Takai, Tsutomu, et al., "Incredible High Performance SAW resonator on Novel Multi-layerd Substrate," International Ultrasonics Symposium Proceedings, Sep. 18-21, 2016, Tours, France, IEEE, 4 pages.
Takai, Tsutomu, et al., "I.H.P.SAW Technology and its Application to Microacoustic Components (Invited)," International Ultrasonics Symposium, Sep. 6-9, 2017, Washington DC, IEEE, 8 pages.
Non-Final Office Action for U.S. Appl. No. 15/086,895, dated Dec. 15, 2017, 6 pages.
Notice of Allowance for U.S. Appl. No. 15/086,936, dated Jul. 9, 2018, 8 pages.
Non-Final Office Action for U.S. Appl. No. 15/087,225, dated Jun. 21, 2018, 5 pages.

(56) References Cited

OTHER PUBLICATIONS

Non-Final Office Action for U.S. Appl. No. 15/087,423, dated Jul. 31, 2018, 17 pages.
International Search Report and Written Opinion for International Patent Application No. PCT/US2017/014806, dated Apr. 21, 2017, 12 pages.
International Preliminary Report on Patentability for PCT/US2017/014806, dated Aug. 9, 2018, 9 pages.
International Preliminary Report on Patentability for PCT/US2017/014808, dated Aug. 9, 2018, 6 pages.
International Search Report and Written Opinion for International Patent Application No. PCT/US2017/014808, dated Apr. 19, 2017, 9 pages.
Gomi, Masashi, et al., "High-Coupling Leaky SAWs on LiNbO3 or LiTaO3 Thin Plate Bonded to High-Velocity Substrate," Proceedings of Symposium on Ultrasonic Electronics, vol. 37, Nov. 16-18, 2016, 2 pages.
Gomi, Mashashi, et al., "High-coupling leaky surface acoustic waves on LiNBO3 or LiTaO3 thin plate bonded to high-velocity substrate," Japanese Journal of Applied Physics, vol. 56, Jun. 27, 2017, Japan Society of Applied Physics, 7 pages.
Hayashi, Junki, et al., "High-Coupling Leaky SAWs on LiTaO3 Thin Plate Bonded to Quartz Substrate," International Ultrasonics Symposium, Sep. 6-9, 2017, Washington, DC, IEEE, 4 pages.
Kadota, Micho, et al., "HAL SAW Resonators Using 42oYX-LiTaO3 Thin Plate on Quartz Substrate," International Frequency Control Symposium, Jul. 9-13, 2017, Besancon, France, IEEE, 2 pages.
Examination Report for European Patent Application No. 18196819.9, dated Jul. 1, 2020, 4 pages.
Notice of Reason for Rejection for Japanese Patent Application No. 2018-539285, dated Sep. 18, 2020, 23 pages.
Notice of Reason for Rejection for Japanese Patent Application No. 2018-539290, dated Sep. 2, 2020, 21 pages.
Notice of Reason for Rejection for Japanese Patent Application No. 2018-539290, dated Jan. 4, 2021, 6 pages.
Notice of Reason for Rejection for Japanese Patent Application No. 2018-539285, dated Feb. 1, 2021, 11 pages.
Decision to Grant for Japanese Patent Application No. 2018-539290, dated Mar. 29, 2021, 5 pages.
Non-Final Office Action for U.S. Appl. No. 16/037,259, dated Dec. 4, 2020, 14 pages.

\* cited by examiner

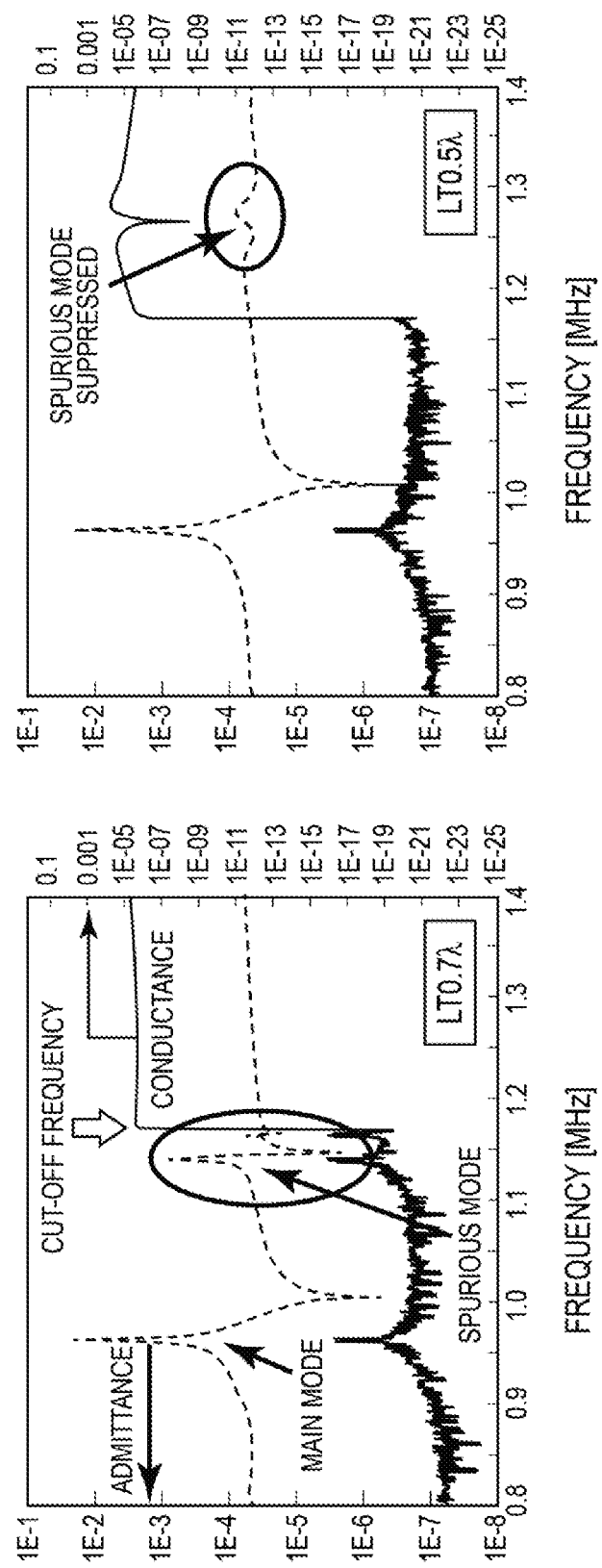

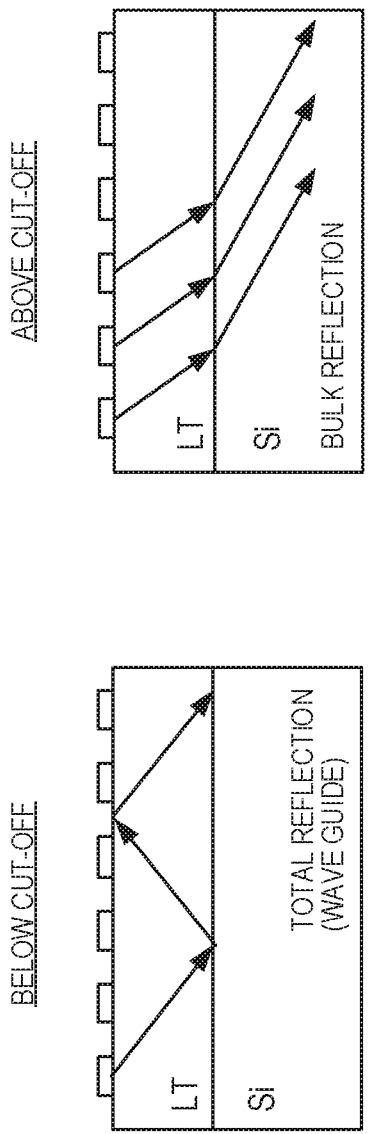

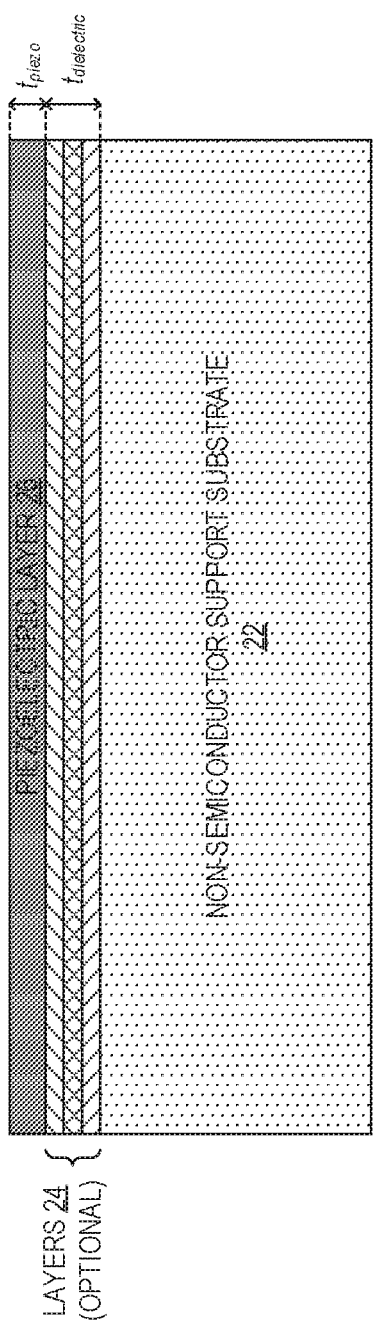

GUIDED SURFACE ACOUSTIC WAVE DEVICE PROVIDING SPURIOUS MODE REJECTION

RELATED APPLICATIONS

This application is a continuation of U.S. patent application Ser. No. 15/086,936, filed Mar. 31, 2016, now U.S. Pat. No. 10,128,814, which claims the benefit of provisional patent application Ser. No. 62/288,244, filed Jan. 28, 2016, the disclosures of which are hereby incorporated herein by reference in their entireties.

This application is related to:
U.S. patent application Ser. No. 15/087,225, entitled BONDED WAFERS AND SURFACE ACOUSTIC WAVE DEVICES USING SAME, which was filed Mar. 31, 2016, now U.S. Pat. No. 10,574,203;
U.S. patent application Ser. No. 15/087,423, entitled METHODS FOR FABRICATION OF BONDED WAFERS AND SURFACE ACOUSTIC WAVE DEVICES USING SAME, which was filed Mar. 31, 2016, now U.S. Pat. No. 10,381,998; and
U.S. patent application Ser. No. 15/086,895, entitled SURFACE ACOUSTIC WAVE DEVICE HAVING A PIEZOELECTRIC LAYER ON A QUARTZ SUBSTRATE AND METHODS OF MANUFACTURING THEREOF, which was filed Mar. 31, 2016, now U.S. Pat. No. 10,084,427;
all of which are commonly owned and assigned and are hereby incorporated herein by reference in their entireties.

FIELD OF THE DISCLOSURE

The present disclosure relates to a Surface Acoustic Wave (SAW) device.

BACKGROUND

Surface Acoustic Wave (SAW) devices, such as SAW resonators and SAW filters, are used in many applications such as Radio Frequency (RF) filters. For example, SAW filters are commonly used in Second Generation (2G), Third Generation (3G), and Fourth Generation (4G) wireless transceiver front ends, duplexers, and receive filters. The widespread use of SAW filters is due to, at least in part, that fact that SAW filters exhibit low insertion loss with good rejection, can achieve broad bandwidths, and are a small fraction of the size of traditional cavity and ceramic filters. As with any electronic device, the performance of a SAW device is an important parameter that can impact the overall performance of a system. In this regard, there is a need for a high performance SAW device.

SUMMARY

Embodiments of a Surface Acoustic Wave (SAW) device having a guided SAW structure that provides spurious mode suppression and methods of fabrication thereof are disclosed. In some embodiments, a SAW device includes a non-semiconductor support substrate, a piezoelectric layer on a surface of the non-semiconductor support substrate, and at least one interdigitated transducer (IDT) on a surface of the piezoelectric layer opposite the non-semiconductor support substrate. A thickness of the piezoelectric layer, a SAW velocity of the piezoelectric layer, and an acoustic wave velocity of the non-semiconductor support substrate are such that a frequency of spurious modes above a resonance frequency of the SAW device is above a bulk wave cut-off frequency of the SAW device. In this manner, the spurious modes above the resonance frequency of the SAW device are suppressed.

In some embodiments, the piezoelectric layer includes Lithium Tantalate ($LiTaO_3$, which is also referred to herein as LT). In other embodiments, the piezoelectric layer includes Lithium Niobate ($LiNbO_3$).

In some embodiments, the thickness of the piezoelectric layer is less than two times $\lambda$, where $\lambda$ is a wavelength of the resonance frequency of the SAW device, and the cut-off frequency is greater than $fa+(fa-fr)/2$, where fr is a resonance frequency of the SAW device and fa is an anti-resonance frequency of the SAW device. The wavelength $\lambda$ can be defined from a transducer, or electrode, period of the at least one IDT. In many cases, the wavelength $\lambda$ is twice the electrode period. Further, in some embodiments, a velocity of a slowest acoustic mode in a propagation direction of the non-semiconductor support substrate is less than 6,984 meters per second. In other embodiments, a velocity of a slowest acoustic mode in a propagation direction of the non-semiconductor support substrate is less than 6,000 meters per second. In other embodiments, a velocity of a slowest acoustic mode in a propagation direction of the non-semiconductor support substrate is less than 5,400 meters per second.

In some embodiments, the thickness of the piezoelectric layer is less than two times $\lambda$, where $\lambda$ is a wavelength of the resonance frequency of the SAW device, and the velocity of the slowest acoustic mode in the propagation direction of the non-semiconductor support substrate is between 1.07 times a surface wave velocity in the at least one IDT and 6,984 meters per second. In other embodiments, the thickness of the piezoelectric layer is less than two times $\lambda$, where $\lambda$ is a wavelength of the resonance frequency of the SAW device, and the velocity of the slowest acoustic mode in the propagation direction of the non-semiconductor support substrate is between 1.07 times a surface wave velocity in the at least one IDT and 6,000 meters per second. In other embodiments, the thickness of the piezoelectric layer is less than two times $\lambda$, where $\lambda$ is a wavelength of the resonance frequency of the SAW device, and the velocity of the slowest acoustic mode in the propagation direction of the non-semiconductor support substrate is between 1.07 times a surface wave velocity in the at least one IDT and 5,400 meters per second.

In some embodiments, the thickness of the piezoelectric layer is less than a defined maximum thickness of the piezoelectric layer that supports spurious mode suppression, the defined maximum thickness of the piezoelectric layer being a function of both the SAW velocity of the piezoelectric layer and a velocity of a slowest acoustic mode of the non-semiconductor support substrate.

In some embodiments, there are no dielectric layers between the non-semiconductor support substrate and the piezoelectric layer, the piezoelectric layer comprises rotated Y-cut, X propagation LT, and the defined maximum thickness of the piezoelectric layer is, in units of $\lambda$, $1.76-2.52 \times 10^{-4} \times (V_{sub}+4210-(-2.435\times10^{-9}\theta^6+1.103\times10^{-6}\theta^5-1.719\times10^{-4}\theta^4+1.145\times10^{-2}\theta^3 4.229\times10^{-1}\theta^2+9.765\theta+4.103\times10^3))$, where $V_{sub}$ is a velocity of a slowest acoustic mode in a propagation direction of the non-semiconductor support substrate and $\theta$ is a cut-angle of the rotated Y-cut LT. Further, in some embodiments, the thickness of the piezoelectric layer is greater than $0.05$ times $\lambda$, where $\lambda$ is a wavelength of the resonance frequency of the SAW device, and a velocity of a slowest acoustic mode in a propagation direction of the non-semiconductor support substrate is less than 6,984 meters per second. In some other embodiments, the thickness of the piezoelectric layer is greater than 0.1 times λ, where λ is a wavelength of the resonance frequency of the SAW device, and a velocity of a slowest acoustic mode in a propagation direction of the non-semiconductor support substrate is less than 6,984 meters per second. In some other embodiments, a velocity of a slowest acoustic mode in a propagation direction of the non-semiconductor support substrate is less than 6,000 meters per second. In some other embodiments, a velocity of a slowest acoustic mode in a propagation direction of the non-semiconductor support substrate is less than 5,400 meters per second.

In some other embodiments, the SAW device further includes a Silicon Oxide dielectric layer between the non-semiconductor support substrate and the piezoelectric layer, wherein the piezoelectric layer comprises rotated Y-cut, X propagation LT and the defined maximum thickness of the piezoelectric layer is, in units of λ, $1.76-2.52 \times 10^{-4} \times \{V_{sub} + 4210 - (-2.435 \times 10^{-9} \theta^6 + 1.103 \times 10^{-6} \theta^5 - 1.719 \times 10^{-4} \theta^4 + 1.145 \times 10^{-2} \theta^3 - 4.229 \times 10^{-1} \theta^2 + 9.765 \theta + 4.103 \times 10^3)\} - 0.50 \times T_{SiO2}$, where $V_{sub}$ is a velocity of a slowest acoustic mode in a propagation direction of the non-semiconductor support substrate, θ is a cut-angle of the rotated Y-cut LT, and $T_{SiO2}$ is a thickness of the Silicon Oxide dielectric layer. In some embodiments, the thickness of the piezoelectric layer is greater than 0.05 times λ, where λ is a wavelength of the resonance frequency of the SAW device, and a velocity of a slowest acoustic mode in a propagation direction of the non-semiconductor support substrate is less than 6,984 meters per second. In some other embodiments, the thickness of the piezoelectric layer is greater than 0.1 times λ, where λ is a wavelength of the resonance frequency of the SAW device, and a velocity of a slowest acoustic mode in a propagation direction of the non-semiconductor support substrate is less than 6,984 meters per second. In some other embodiments, a velocity of a slowest acoustic mode in a propagation direction of the non-semiconductor support substrate is less than 6,000 meters per second. In some other embodiments, a velocity of a slowest acoustic mode in a propagation direction of the non-semiconductor support substrate is less than 5,400 meters per second.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A and 5B show simulated admittance and conductance of one example of a guided SAW resonator having a rotated Y-cut Lithium Tantalate (LT) piezoelectric layer with a 42 degree cut-angle (referred to herein as 42LT) on a Silicon (Si) support substrate;

FIGS. 5C and 5D illustrate that the spurious mode is guided if the frequency of the spurious mode is less than the cut-off frequency of the guided SAW device and is suppressed if the frequency of the spurious mode is above the cut-off frequency of the guided SAW device;

FIGS. 13A through 13H illustrate a process for fabricating the guided SAW device of FIG. 4 according to some other embodiments of the present disclosure.

DETAILED DESCRIPTION

Figure 1:
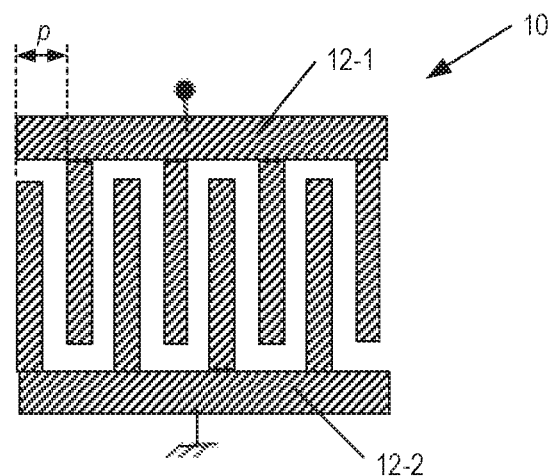
FIG. 1 is a diagram showing the principle of a Surface Acoustic Wave (SAW) interdigitated transducer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Before describing embodiments of the present disclosure, a discussion of Surface Acoustic Wave (SAW) devices and some associated problems is beneficial. SAW filters use the propagation of acoustic waves at the surface of a piezoelectric substrate. FIG. 1 shows one example of a SAW Interdigitated Transducer (IDT) 10. As illustrated, the IDT 10 includes two interdigitated electrodes 12-1 and 12-2 that are deposited on (e.g., directly on) the surface of a piezoelectric substrate (not shown). A voltage is applied between the two electrodes 12-1 and 12-2. This results in electrical fields between the two electrodes 12-1 and 12-2 and generation of SAWs by the piezoelectric effect. Due to the sequence of electrodes at alternate potentials, the fields for two consecutive periods are of opposite directions. This means that the IDT 10 has its maximum efficiency when the electrode period is half the acoustic wavelength. The wavelength λ of the resonance frequency of the SAW device can be defined from a transducer, or electrode, period (p) of the IDT 10. In many cases, the wavelength λ is twice the electrode period (p).

Figure 2:
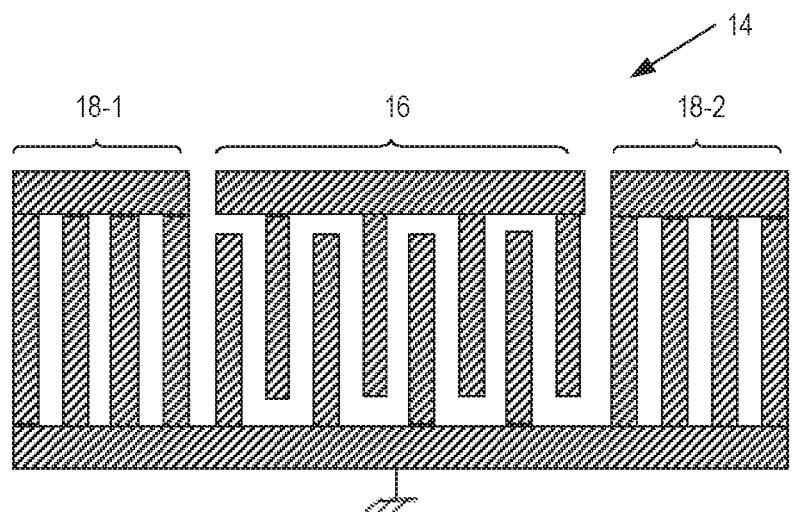
FIG. 2 is a diagram of a SAW resonator.

FIG. 2 shows one example of a SAW resonator 14. The SAW resonator 14 includes an IDT 16 inserted between two gratings 18-1 and 18-2, which are connected to ground in FIG. 2. The two gratings 18-1 and 18-2 act as reflectors and define an (acoustic) cavity. The choice of the piezoelectric substrate influences the performances which can be obtained. Commonly, the substrate is chosen such that the acoustic mode is a so-called leaky SAW mode or shear horizontal mode. This type of mode presents normally the advantage of a better coupling coefficient. Usual types of substrates for these modes are Lithium Tantalate with an orientation close to Y+36 degrees or Lithium Niobate with an orientation close to Y. In both cases, the propagation direction is normally the x axis of the crystal. The issue with this type of mode is that a large portion of the energy is radiated in the bulk of the substrate creating losses. One approach to solve this problem is to replace the piezoelectric substrate by a piezoelectric film bonded on a support substrate. If the acoustic velocities in the support substrates are faster than the velocities in the film, then the wave is guided in the piezoelectric film.

Figure 3:
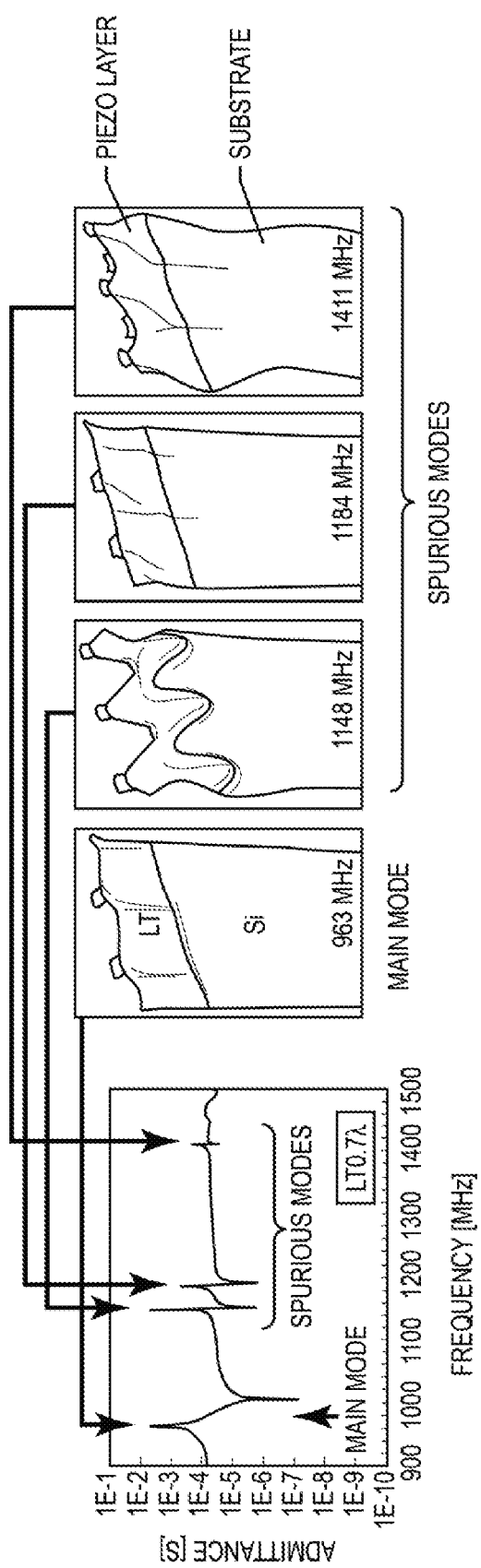
FIG. 3 illustrates one example of spurious modes generated in a guided SAW device above the resonance frequency of the guided SAW device.

Guided SAW devices (i.e., SAW devices having a guided SAW structure) have a layered substrate where a layer of piezoelectric material, which is referred to here as a piezoelectric layer, is bonded or deposited on (e.g., directly on) the surface of a support, or carrier, substrate. As compared to conventional SAW devices, guided SAW devices have an improved quality factor (Q), an improved electromechanical coupling factor (K2), and an improved Thermal Coefficient of Frequency (TCF). However, unwanted spurious modes are typically generated in a guided SAW structure, which hinders a practical use of a guided SAW device. In particular, in a guided SAW device, spurious modes are generated above the resonance frequency of the guided SAW device and, as a result, out of band rejection specifications may not be satisfied. FIG. 3 illustrates one example of spurious modes generated in a guided SAW device above the resonance frequency of the guided SAW device.

Embodiments of a SAW device having a guided SAW structure (i.e., a guided SAW device) that provide suppression of spurious modes above a resonance frequency of the SAW device are disclosed. In some embodiments, a guided SAW device includes a support, or carrier, substrate of a non-semiconductor material, a piezoelectric layer on a surface of the carrier substrate, and a metal transducer on a surface of the piezoelectric layer opposite the carrier substrate. A thickness of the piezoelectric layer is optimized, taking into consideration a SAW velocity of the piezoelectric layer and an acoustic velocity of the support substrate, to suppress spurious modes above the resonance frequency of the guided SAW device. In particular, in some embodiments, the thickness of the piezoelectric layer, the SAW velocity of the piezoelectric layer, and the acoustic velocity of the support substrate are such that a frequency of a spurious mode (e.g., a spurious mode above the resonance frequency of the guided SAW device that is, as compared to other spurious modes above the resonance frequency of the guided SAW device, closest to the resonance frequency of the guided SAW device) is greater than a cut-off frequency (also referred to as the bulk wave cut-off frequency) of the SAW device. In some embodiments, the thickness of the piezoelectric layer, a cut-angle of the piezoelectric layer (where the SAW velocity of the piezoelectric layer is a function of the cut-angle of the piezoelectric layer), and the acoustic velocity of the support substrate are such that a frequency of a spurious mode (e.g., a spurious mode above the resonance frequency of the guided SAW device that is, as compared to other spurious modes above the resonance frequency of the guided SAW device, closest to the resonance frequency of the guided SAW device) is greater than the cut-off frequency (also referred to as the bulk wave cut-off frequency) of the SAW device. In some embodiments, the thickness of the piezoelectric layer is less than a defined maximum thickness of the piezoelectric layer that provides spurious mode rejection, where the defined maximum thickness of the piezoelectric layer that provides spurious mode rejection is a function of both a SAW velocity in the piezoelectric layer (which is a function of the cut-angle of the piezoelectric layer) and an acoustic velocity in the support substrate (i.e., the velocity of a slowest acoustic mode in the propagation direction in the support substrate). In other words, embodiments of the present disclosure suppress spurious modes by selecting a piezoelectric layer thickness as a function of the SAW velocity in the piezoelectric layer (which is a function of the cut-angle of the piezoelectric layer) and the acoustic velocity in the support substrate (i.e., the velocity of the slowest acoustic mode in the propagation direction in the support substrate), thereby keeping higher Q, higher K2, and better TCF. Further, the support substrate is not a semiconductor, which degrades resonator Q due to its conductivity.

Figure 4:
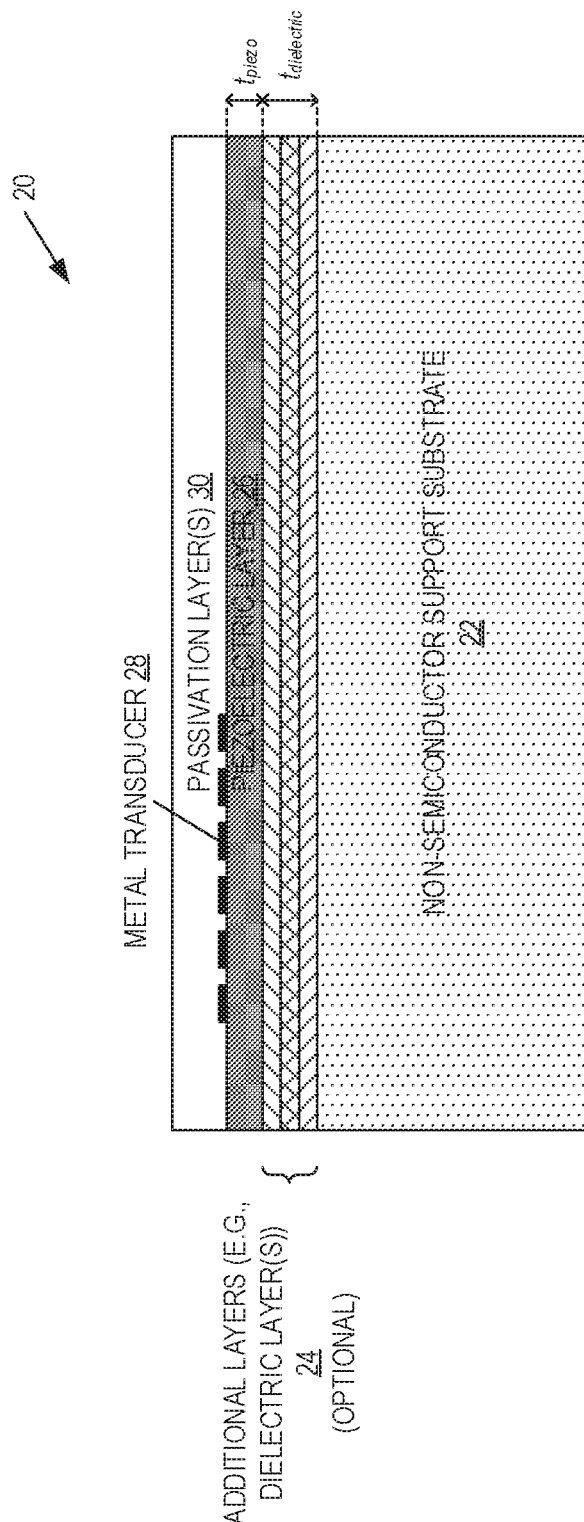
FIG. 4 illustrates one example of a guided SAW device that provides spurious mode suppression according to some embodiments of the present disclosure.

In this regard, FIG. 4 illustrates one example of a guided SAW device 20 according to some embodiments of the present disclosure. As illustrated, the guided SAW device 20 includes a support, or carrier, substrate 22 that is not a semiconductor (and is therefore sometimes referred to herein as a non-semiconductor support substrate 22), optionally one or more additional layers 24 (e.g., one or more dielectric layers) on (e.g., directly on) the surface of the support substrate 22, a piezoelectric layer 26 on the surface of the one or more additional layers 24 opposite the support substrate 22, a metal transducer, or IDT, 28 on the surface of the piezoelectric layer 26 opposite the support substrate 22, and optionally one or more passivation layers 30 on the surface of the metal transducer 28 and the exposed portions of the surface of the one or more additional layers 24. Alternatively, there may be no additional layer(s) 24 such that the piezoelectric layer 26 is on (e.g., directly on) the surface of the support substrate 22 and the optional passivation layer(s) 30 is on the surface of the metal transducer 28 and the exposed surface of the support substrate 22. In general, a thickness ($t_{piezo}$) of the piezoelectric layer 26 is less than $2\lambda$, where $\lambda$ is a wavelength of the resonance frequency of the guided SAW device 20. In some embodiments, the support substrate 22 is made from a wafer (not a deposited film). In some embodiments, the piezoelectric layer 26 is single crystal (not a deposited film). As it is known, in some cases, the layers 24 or the passivation layers 30 can include Silicon Oxide to reduce sensitivity of the device frequency to the temperature. As it is also known, the temperature sensitivity can be reduced further by doping the Silicon Oxide with dopant containing Fluorine or Boron, for example. If the layers between the support substrate and the piezoelectric substrate are very thick (more than several wavelengths) and with high acoustic velocity like Aluminum Nitride, Diamond or Silicon Carbide then there is almost no acoustic energy in the support substrate and the acoustic properties of the substrate have no impact on the result. The substrate can be replaced acoustically by a thick film with high acoustic velocity. Unfortunately, thick film are very expensive to manufacture and difficult to control. In this disclosure, the layers are assumed to be thin and slow enough to have a significant portion of the acoustic energy in the wafer. The acoustic properties of the support substrate described are normally the acoustic properties of the wafer supporting the films.

If the Bulk Acoustic Wave (BAW) velocity of the slowest acoustic mode of the support substrate 22 in the direction of propagation of the SAW is larger than the velocity of the guided SAW device 20, then it is possible to guide the acoustic energy inside the piezoelectric layer 26, and the loss into the bulk can be cancelled. Several intermediate layers (e.g., the one or more additional layers 24) can be placed between the piezoelectric layer 26 and the support substrate 22. These layers can be used to improve the acoustic guiding or the piezoelectric coupling, or reduce temperature sensitivity, or they may be required for the manufacturing process of the guided SAW device 20. For example, this type of approach has been proposed in U.S. Pat. No. 6,445,265, entitled DEVICE WITH ACOUSTIC WAVES GUIDED IN A FINE PIEZOELECTRIC MATERIAL FILM BONDED WITH A MOLECULAR BONDING ON A BEARING SUBSTRATE AND METHOD FOR MAKING THE SAME, issued Sep. 3, 2002; French Patent No. 2788176, entitled DISPOSITIF A ONDES ACOUSTIQUES GUIDEES DANS UNE FINE COUCHE DE MATERIAU PIEZO-ELECTRIQUE COLLEE PAR UNE COLLE MOLECULAIRE SUR UN SUBSTRAT PORTEUR ET PROCEDE DE FABRICATION, issued May 25, 2001; Solal, M. et al., "Oriented Lithium Niobate Layers Transferred on 4" [100] Silicon Wafer for RF SAW Devices," Proceedings of the 2002 IEEE Ultrasonics Symposium, Vol. 1, Oct. 8-11, 2002, pages 131-134 (hereinafter "Solal)"); and Pastureaud, T. et al., "High-Frequency Surface Acoustic Waves Excited on Thin-Oriented $LiNbO_3$ Single-Crystal Layers Transferred onto Silicon," IEEE Transactions on Ultrasonics, Ferroelectrics, and Frequency Control, Vol. 54. No. 4, April 2007, pages 870-876 (hereinafter "Pastureaud"). These documents disclose a SAW device built on a thin layer of piezoelectric material on top of a carrier substrate. Other layers can be present between the piezoelectric layer 26 and the support substrate 22. These intermediate layers are usually dielectric layers, but in some cases it was proposed to use metallic layers. Piezoelectric layers are also possible. The velocity in the carrier substrate is large enough to allow the acoustic wave to be guided.

As discussed above, conventional guided SAW devices generate spurious modes above the resonance frequency of the SAW device. In order to suppress these spurious modes, the thickness ($t_{piezo}$) of the piezoelectric layer 26, the SAW velocity in the piezoelectric layer 26, and the slowest acoustic velocity in the support substrate 22 in the direction of propagation are such that the frequency of the spurious modes is greater than the bulk cut-off frequency of the guided SAW device 20. Note that the spurious modes are the modes linked to the thickness of the piezoelectric layer 26 and the dielectric layer(s) 14. They are higher order or other guided modes in the structure. There may be some other spurious modes (e.g., transverse modes) which are not the modes of interest in the present disclosure. More specifically, the thickness ($t_{piezo}$) of the piezoelectric layer 26, the SAW velocity of the piezoelectric layer 26 (where changing the SAW velocity of the piezoelectric layer 26 is equivalent to changing the acoustic velocity of the support substrate 22), and the acoustic velocity of the support substrate 22 (i.e., the velocity of the slowest acoustic mode in the support substrate 22 in the direction of propagation) are such that the frequency of the spurious modes is greater than the cut-off frequency of the guided SAW device 20. Note that the SAW velocity of the piezoelectric layer 26 is sometimes referred to herein simply as the velocity of the piezoelectric layer 26. Similarly, the acoustic velocity of the support substrate 22 is sometimes referred to herein simply as the velocity of the support substrate 22.

In some embodiments, the velocity of the piezoelectric layer 26 is a function of the cut-angle of the piezoelectric material used for the piezoelectric layer 26 such that the thickness ($t_{piezo}$) of the piezoelectric layer 26 and the cut-angle of the piezoelectric layer 26 are such that, when taken together with the velocity of the support substrate 22, the frequency of the spurious modes is greater than the cut-off frequency of the guided SAW device 20. In other words, in some embodiments, the thickness ($t_{piezo}$) of the piezoelectric layer 26 is less than a defined maximum thickness of the piezoelectric layer 26 that provides spurious mode suppression, where the defined maximum thickness of the piezoelectric layer 26 is a function of the velocity in the piezoelectric layer 26 (which is a function of the cut-angle of the piezoelectric layer 26) and the velocity in the support substrate 22.

A discussion of specific limitations on the thickness of the piezoelectric layer 26 and the velocity of the support substrate 22 will now be provided for some specific examples of the guided SAW device 20 in which the piezoelectric layer 26 is Lithium Tantalate ($LiTaO_3$, which is referred to herein as LT). However, this description can be easily extended to other types of piezoelectric materials such as, for example, Lithium Niobate ($LiNbO_3$, which is referred to herein as LN). Further, in some examples, the LT is rotated, Y-cut LT. The orientation of the LT may be, for example, between Y and Y+60 degrees. In some alternative embodiments, the piezoelectric layer is 27 is rotated, Y-cut LN. The orientation of the LN may be, for example, between Y-20 degrees and Y+60 degrees.

FIGS. 5A and 5B show simulated admittance and conductance of one example of a guided SAW device (specifically as guided SAW resonator) having a rotated Y-cut LT piezoelectric layer with a 42 degree cut-angle (referred to herein as 42LT) on a Silicon (Si) support substrate. Note that, unlike the guided SAW device 20 of FIG. 4, the Si support substrate used for these simulations is a semiconductor. Nevertheless, the simulations illustrate concepts that are utilized to derive, e.g., the maximum thickness of the piezoelectric layer 26 and the cut-angle of the piezoelectric layer 26 that provides spurious mode rejection. As illustrated in FIGS. 5A and 5B, conductance rapidly increases at the cut-off frequency of the guided SAW device 20 because the BAW cannot be guided above the cut-off frequency. The cut-off frequency is determined by the velocity in the support substrate 22 (the higher velocity is the higher cut-off frequency). In particular, FIG. 5A shows a simulation in which the frequency of the spurious mode is below the cut-off frequency, in which case the spurious mode is guided, as illustrated in FIG. 5C, and therefore is not suppressed, as illustrated in FIG. 5A. Conversely, FIG. 5B shows a simulation in which the frequency of the spurious mode is above the cut-off frequency, in which case the spurious mode is not guided, as illustrated in FIG. 5D, and therefore is suppressed, as illustrated in FIG. 5B. Thus, from the simulations in FIGS. 5A and 5B, it can be easily seen that, for spurious mode suppression, the frequency of the spurious mode needs to be above the cut-off frequency of the guided SAW device 20. The model used for the simulation assumes a transducer or resonator with an infinite aperture and an infinite length (periodic model). The spurious modes of interest in the present disclosure are higher order or other guided modes in the layer(s). Other spurious modes linked to finite length or aperture of the transducer or resonator can exist in the device. Several approaches are known to suppress these spurious modes, but the only way to suppress the spurious modes due to the thickness of the layers is to change the nature or orientation of support substrate and the layers and/or their thicknesses.

Figure 5E:
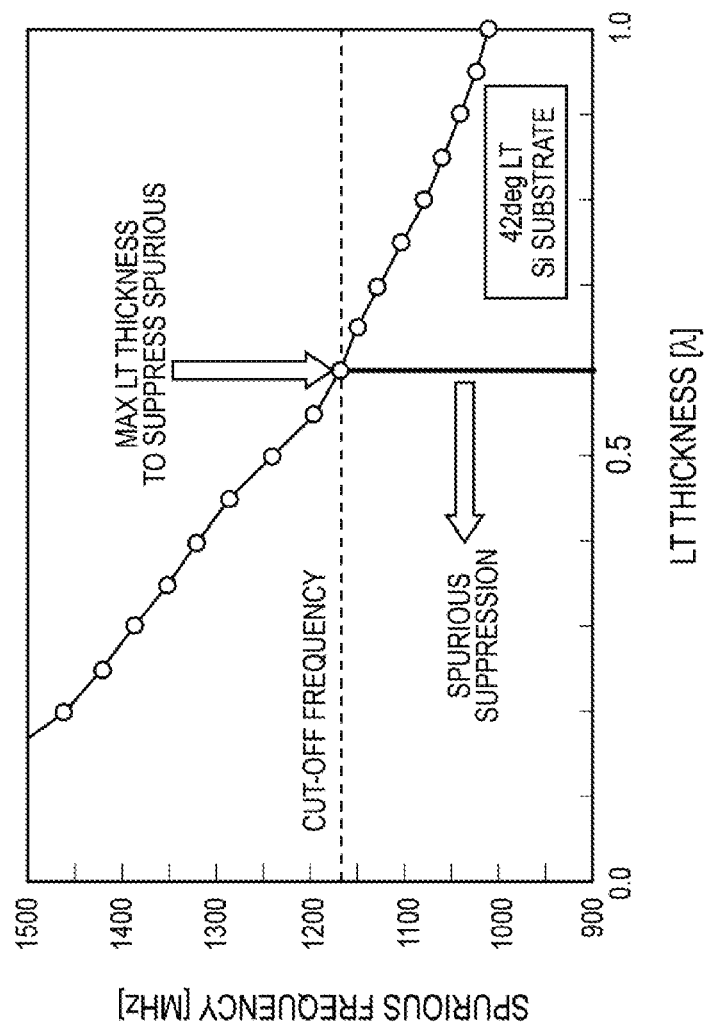
FIG. 5E shows the relationship of the thickness ($t_{piezo}$) of the piezoelectric layer and frequency of spurious modes for a particular example of a guided SAW device in which the piezoelectric layer is 42LT on an Si support substrate.

FIG. 5E shows the relationship of the thickness ($t_{piezo}$) of a piezoelectric layer and the frequency of spurious modes for a particular example of a guided SAW device in which the piezoelectric layer is 42LT on an Si support substrate. Again, note that, unlike the guided SAW device 20 of FIG. 4, the Si support substrate used for these simulations is a semiconductor. Nevertheless, the simulations illustrate concepts that are utilized to derive, e.g., the maximum thickness of the piezoelectric layer 26 and the cut-angle of the piezoelectric layer 26 that provides spurious mode rejection. As shown in FIG. 5E, as the thickness ($t_{piezo}$) of the piezoelectric layer becomes thinner, the spurious frequency increases while the cut-off frequency does not change. If spurious frequency is above the cut-off frequency, the amplitude of the spurious response is drastically suppressed because those modes are not guided in the piezoelectric layer. From FIG. 5E, it can be seen that the thickness ($t_{piezo}$) of the piezoelectric layer should be less than 0.6 lambdas ($\lambda$) to suppress spurious modes in the case of 42LT and the Si support substrate, where $\lambda$ is the wavelength of the resonance frequency of the guided SAW device.

Figure 6A:
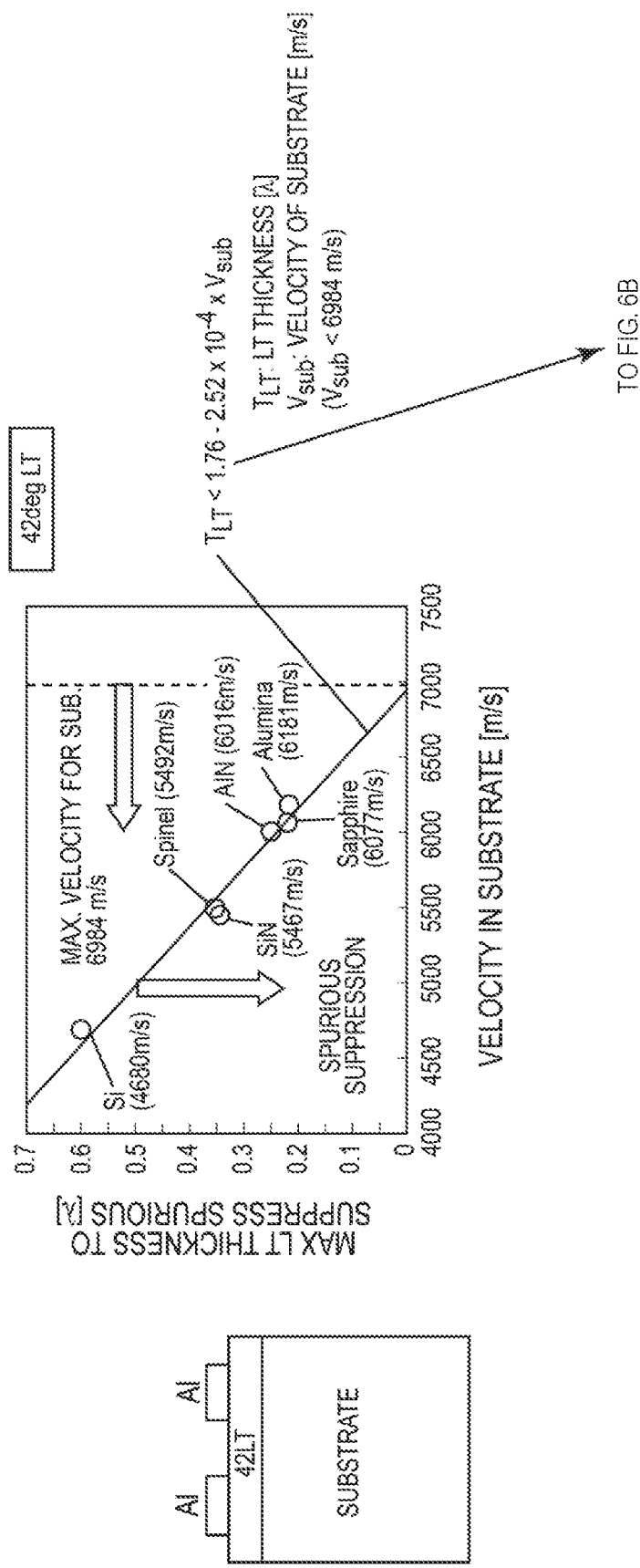
FIG. 6A shows simulation results for the maximum thickness of the 42LT piezoelectric layer that provides spurious mode suppression on various different types of support substrates (i.e., Si, Silicon Nitride (SiN), Spinel, Aluminum Nitride (AlN), Sapphire, and Alumina)

As discussed above, the simulation of FIG. 5E was performed for a guided SAW device having a 42LT piezoelectric layer on a Si support substrate. However, the maximum thickness for the 42LT piezoelectric layer that provides spurious mode suppression will vary depending on the material used for the support substrate. As such, FIG. 6A shows simulation results for the maximum thickness of the 42LT piezoelectric layer on various different types of support substrates (i.e., Si, Silicon Nitride (SiN), Spinel, Aluminum Nitride (AlN), Sapphire, and Alumina). By conducting the same simulations performed for FIG. 5E using the different materials for the support substrate, it was found that the maximum thickness of the 42LT that provides spurious mode suppression and velocity in the support substrate have a linear relationship as shown in FIG. 6A. By performing a curve fit to the simulated data points, the maximum thickness of the 42LT that provides spurious mode suppress as a function of velocity in the support substrate 22 ($V_{sub}$) can be expressed as:

$$T_{LT} < 1.76 - 2.52 \times 10^{-4} \times V_{sub} \quad (1)$$

where $T_{LT}$ is the thickness of the 42LT in units of $\lambda$, $V_{sub}$ is the slowest acoustic velocity of the support substrate 22 in the propagation direction in units of meters per second (m/s), and $V_{sub}$ is less than 6984 m/s.

Figure 6B:
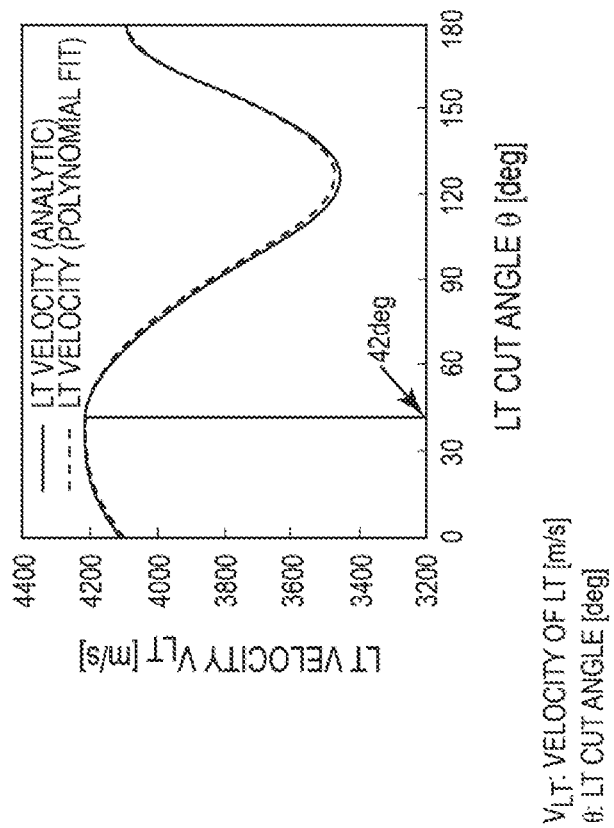
FIG. 6B illustrates LT velocity variation as a function of cut-angle.

The simulation results shown in FIG. 6A, and thus Equation (1) above, is for 42LT. However, the maximum thickness of the LT that provides spurious mode suppression is also a function of the cut-angle of the LT. If a different cut-angle of LT is used, the SAW velocity in the LT (referred to herein as the LT velocity) will change, which is equivalent to a change in the velocity of the support substrate 22. In this regard, FIG. 6B illustrates LT velocity variation as a function of cut-angle. This curve was fitted by the polynomial equation:

$$V_{LT} = -2.435 \times 10^{-9}\theta^6 + 1.103 \times 10^{-6}\theta^5 - 1.719 \times 10^{-4}\theta^4 + 1.145 \times 10^{-2}\theta^3 - 4.229 \times 10^{-1}\theta^2 + 9.765\theta + 4.103 \times 10^3 \quad (2)$$

where $\theta$ is the LT cut-angle in degrees. Using Equation (2), Equation (1) can then be modified to represent the maximum LT thickness that provides spurious mode suppression as a function of the velocity of the support substrate 22 and the cut-angle of the LT as follows:

$$T_{LT} < 1.76 - 2.52 \times 10^{-4} \times (V_{sub} + 4210 - V_{LT}) \quad (3)$$

Substituting for $V_{LT}$ gives:

$$T_{LT} < 1.76 - 2.52 \times 10^{-4} \times (V_{sub} + 4210 - (-2.435 \times 10^{-9}\theta^6 + 1.103 \times 10^{-6}\theta^5 - 1.719 \times 10^{-4}\theta^4 + 1.145 \times 10^{-2}\theta^3 - 4.229 \times 10^{-1}\theta^2 + 9.765\theta + 4.103 \times 10^3)) \quad (4)$$

Thus, Equation (4) defines the maximum LT thickness that provides spurious mode suppression as a function of both the support substrate 22 velocity ($V_{sub}$) and the cut-angle of the LT (equivalently the velocity of the support substrate).

It should be noted that Equation (3) above can be generalized as follows:

$$T_{piezo} < 1.76 - 2.52 \times 10^{-4} \times (V_{sub} + 4210 - V_{piezo}),$$

where $T_{piezo}$ the thickness of the piezoelectric layer 26 and $V_{piezo}$ is the SAW velocity of the piezoelectric layer 26. The velocity of the piezoelectric layer 26 will vary depending on the piezoelectric material used. Equations (3) and (4) above provide an example for LT; however, other piezoelectric materials such as, e.g., LN, may alternatively be used.

Accordingly, in some embodiments of the guided SAW device 20 of FIG. 4, the piezoelectric layer 26 is rotated Y-cut LT (i.e., propagation along the X axis and where the piezoelectric layer 26 has been rotated along the X axis, theta=0 corresponding to the Y-axis normal to the surface), and the thickness ($t_{piezo}$) of the piezoelectric layer 26 is less the maximum LT thickness defined in Equation (4). As can be seen in Equation (4), the maximum thickness for the piezoelectric layer 26 is a function of both the velocity in the support substrate 22 and the velocity in the piezoelectric layer 26. This is true regardless of the piezoelectric material used for the piezoelectric layer 26. Importantly, while the maximum thickness for the piezoelectric layer 26 was derived above for LT, in the same manner, the maximum thickness for the piezoelectric layer 26 when using other piezoelectric materials (e.g., $LiNiO_3$) can be derived in the same manner.

Figures 7A, 7B:
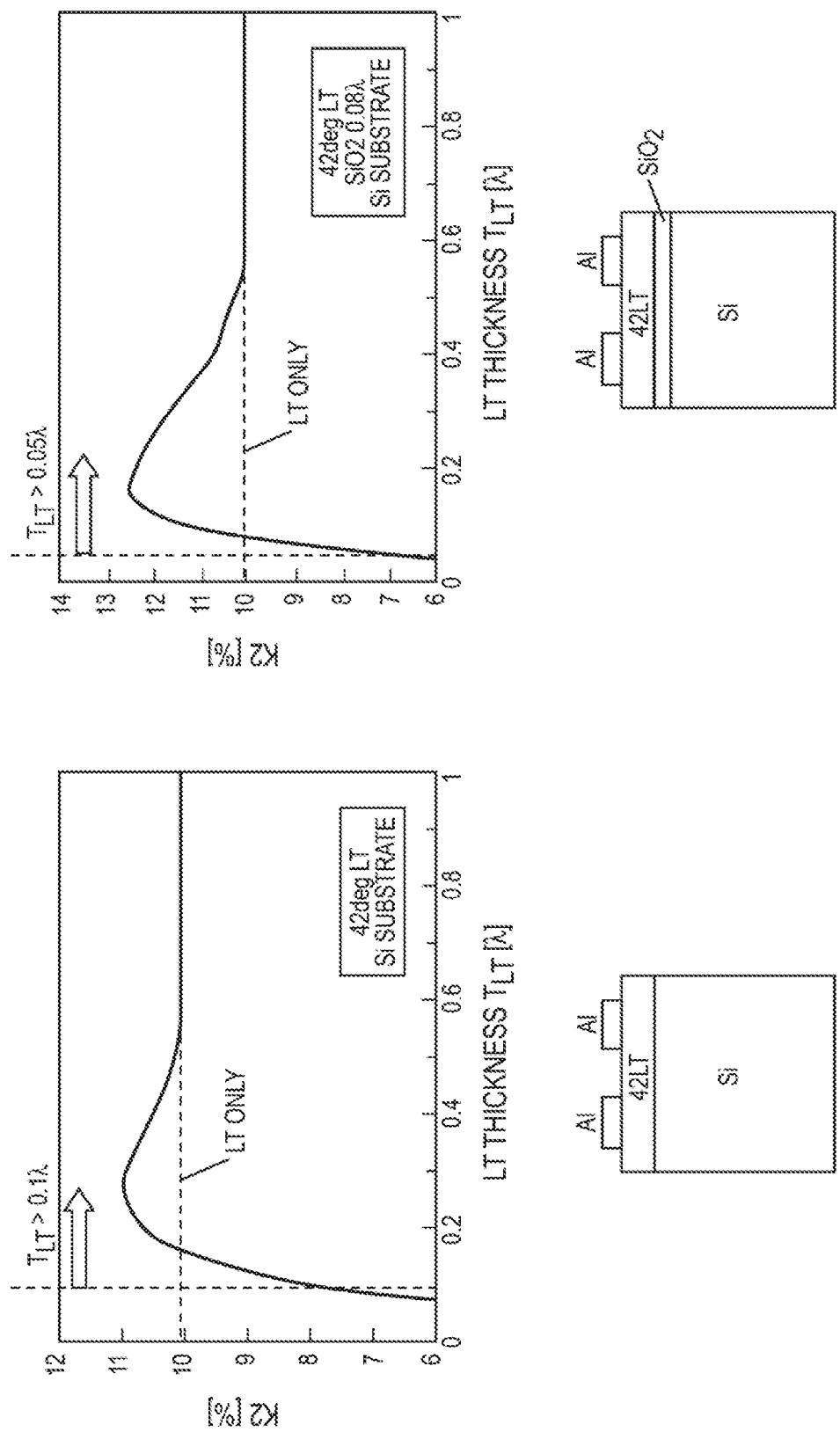
FIG. 7A shows simulation results that illustrate that, in some example embodiments, when there is no dielectric layer(s) (e.g., no Silicon Oxide) between the piezoelectric layer and the support substrate, the minimum thickness of the piezoelectric layer is, at least in some embodiments, 0.1λ in order to, e.g., have enough coupling.
FIG. 7B shows simulation results that illustrate that, in some example embodiments, when a dielectric layer(s) is provided between the piezoelectric layer and the support substrate, the minimum thickness of the piezoelectric layer is, at least in some embodiments, 0.05λ.

Above, a discussion is provided for the maximum thickness of the piezoelectric layer 26 that provides spurious mode rejection. As for the minimum thickness of the piezoelectric layer 26, if the piezoelectric layer 26 is too thin, the piezoelectric coupling will be lost. When there is no dielectric layer(s) (e.g., no Silicon Oxide) between the piezoelectric layer 26 and the support substrate 22, the minimum thickness of the piezoelectric layer 26 is, at least in some embodiments, is $0.1\lambda$ in order to, e.g., have enough coupling, as illustrated by the simulation results shown in FIG. 7A. If there is a dielectric layer(s) between the piezoelectric layer 26 and the support substrate 22, the minimum thickness of the piezoelectric layer 26 is, at least in some embodiments, $0.05\lambda$, as illustrated by the simulation results shown in FIG. 7B. Thus, together with Equation (4), some example ranges for the thickness of the piezoelectric layer 26 when the piezoelectric layer 26 is LT are $0.1\lambda$ to the maximum thickness defined by Equation (4) in some embodiments and $0.05\lambda$ to the maximum thickness defined by Equation (4) in some other embodiments. Note that the $0.1\lambda$ and the $0.05\lambda$ values are only examples and may vary depending on the materials used for the support substrate 22, the piezoelectric layer 26, and, if present, the dielectric layer(s).

Figure 8:
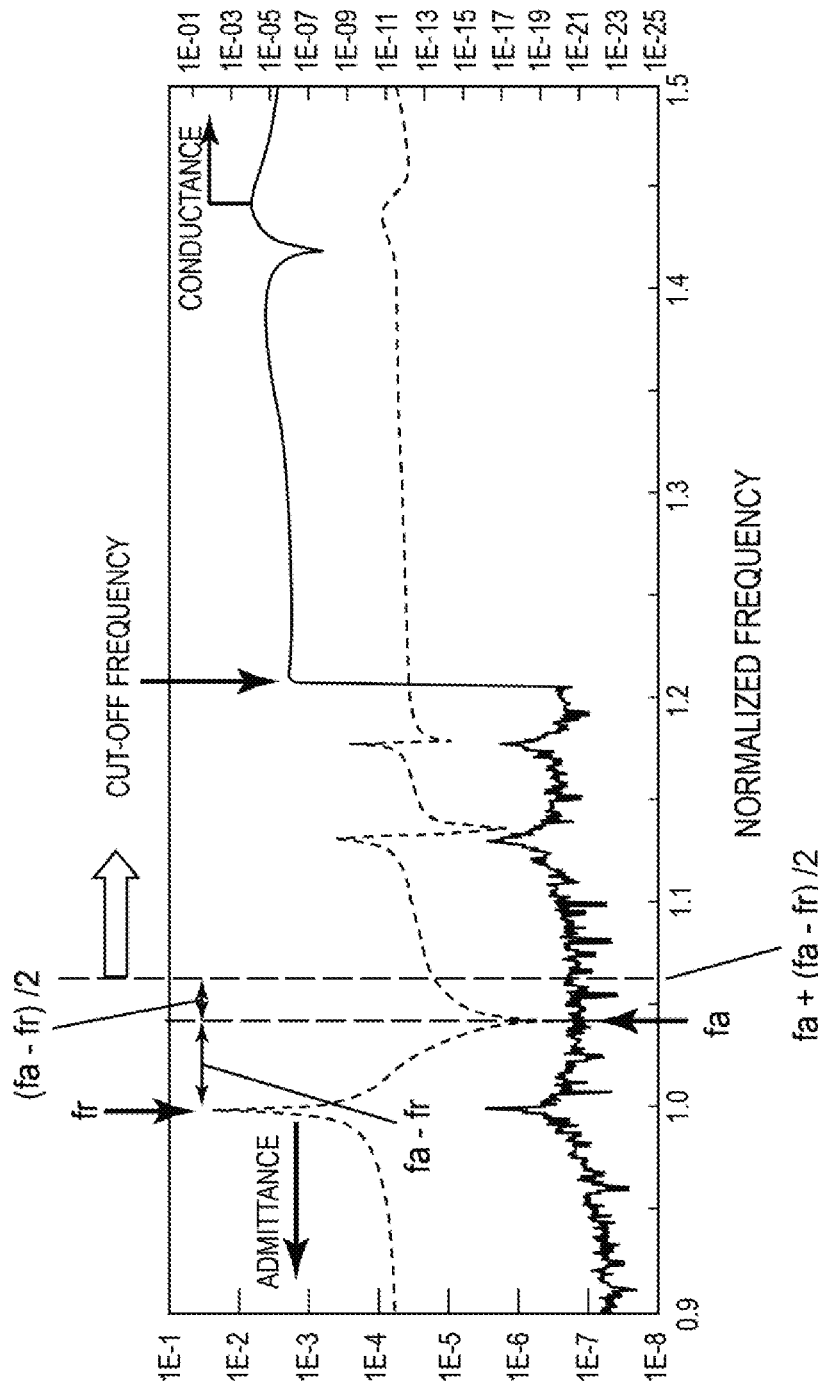
FIG. 8 is an illustration that shows that, in some embodiments, the cut-off frequency of a guided SAW device must be more than fa+(fa−fr)/2, where fr is resonance frequency and fa is anti-resonance frequency of the guided SAW device.
Figure 9:
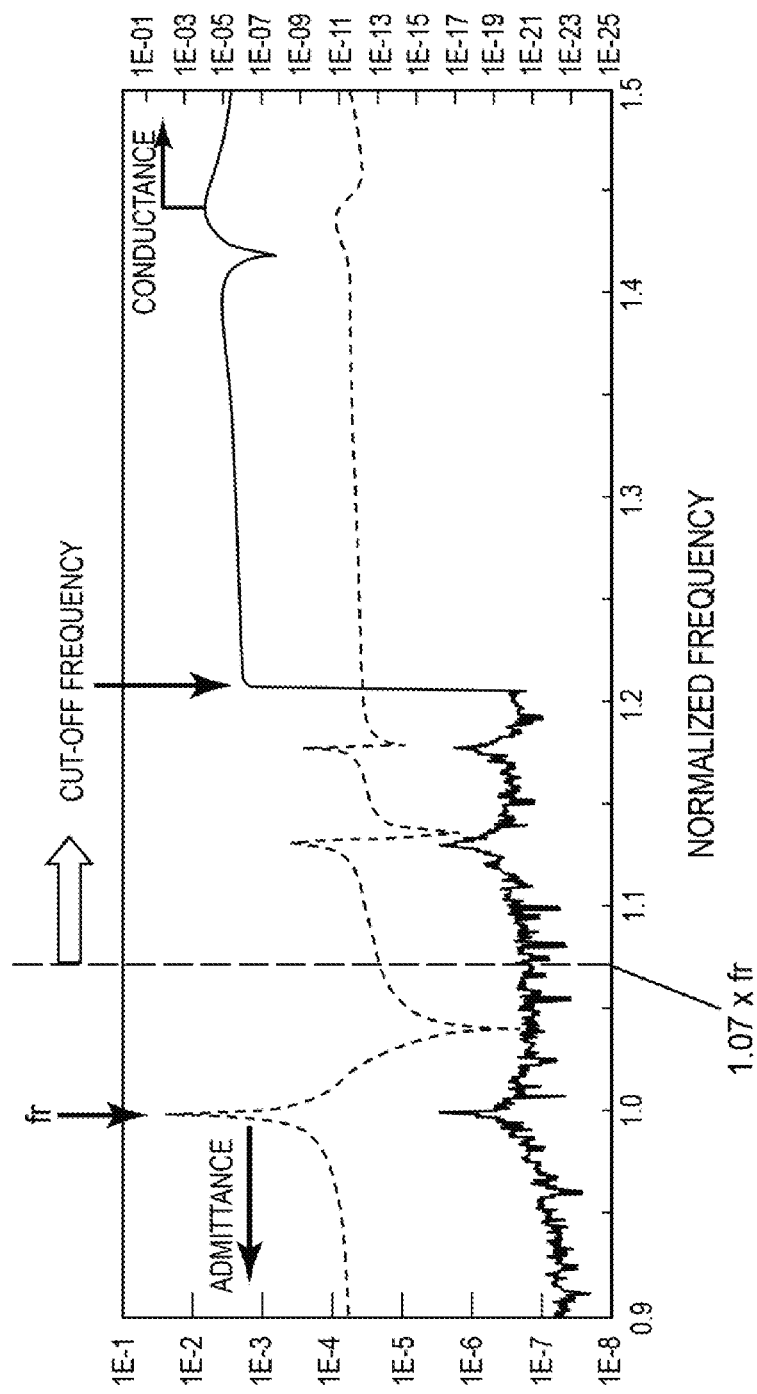
FIG. 9 is an illustration that shows that, in some embodiments, the cut-off frequency of the guided SAW device must be more than 1.07×fr to, e.g., avoid bulk radiation losses.

It should also be noted that, in the guided SAW device 20, waves are guided into the piezoelectric layer 26 when the frequency of those waves is below the cut-off frequency of the guided SAW device 20. So, as illustrated in FIGS. 8 and 9, the cut-off frequency of the guided SAW device 20 is higher than the filter pass band. As illustrated in FIG. 8, in some embodiments, the cut-off frequency of the guided SAW device 20 must be more than fa+(fa−fr)/2, where fr is resonance frequency and fa is anti-resonance frequency of the guided SAW device 20. As illustrated in FIG. 9, in other embodiments, the cut-off frequency of the guided SAW device 20 must be more than 1.07×fr to, e.g., avoid bulk radiation losses. If the SAW device is a filter, a simple way to measure its bulk cut-off frequency is to measure its admittance matrix. At the cut-off frequency, the conductance for one port of the filter will increase drastically. The resonance frequency is normally close to the lower side of the pass-band.

Thus, in some embodiments, the guided SAW device 20 does not include any dielectric layer(s) between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 6,984 m/s. In some other embodiments, the guided SAW device 20 does not include any dielectric layer(s) between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 6,000 m/s. In some other embodiments, the guided SAW device 20 does not include any dielectric layer(s) between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 5,400 m/s.

In some other embodiments, the guided SAW device 20 does not include any dielectric layer(s) between the support substrate 22 and the piezoelectric layer 26, the thickness ($t_{piezo}$) of the piezoelectric layer 26 is less than $2\lambda$, and $V_{sub}$ is between 1.07 times the surface wave velocity in the metal transducer 28 and 6,984 m/s. In some other embodiments, the guided SAW device 20 does not include any dielectric layer(s) between the support substrate 22 and the piezoelectric layer 26, the thickness ($t_{piezo}$) of the piezoelectric layer 26 is less than $2\lambda$, and $V_{sub}$ is between 1.07 times the surface wave velocity in the metal transducer 28 and 6,000 m/s. In some other embodiments, the guided SAW device 20 does not include any dielectric layer(s) between the support substrate 22 and the piezoelectric layer 26, the thickness ($t_{piezo}$) of the piezoelectric layer 26 is less than $2\lambda$, and $V_{sub}$ is between 1.07 times the surface wave velocity in the metal transducer 28 and 5,400 m/s.

In some other embodiments, the guided SAW device 20 includes a Silicon Oxide ($SiO_x$) or Silicon Dioxide ($SiO_2$) dielectric layer between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 6,984 m/s. In some other embodiments, the guided SAW device 20 includes a $SiO_x$ or $SiO_2$ dielectric layer between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 6,000 m/s. In some other embodiments, the guided SAW device 20 includes a $SiO_x$ or $SiO_2$ dielectric layer between the support substrate 22 and the piezoelectric layer 26, the thickness ($t_{piezo}$) of the piezoelectric layer 26 is less than $2\lambda$, the (bulk wave) cut-off frequency of the guided SAW device 20 is more than fa+(fa−fr)/2, and $V_{sub}$ is less than 5,400 m/s.

In some other embodiments, the guided SAW device 20 includes a $SiO_2$ dielectric layer between the support substrate 22 and the piezoelectric layer 26, the thickness ($t_{piezo}$) of the piezoelectric layer 26 is less than 2λ, and $V_{sub}$ is between 1.07 times the surface wave velocity in the metal transducer 28 and 6,984 m/s. In some other embodiments, the guided SAW device 20 includes a $SiO_2$ dielectric layer between the support substrate 22 and the piezoelectric layer 26, the thickness ($t_{piezo}$) of the piezoelectric layer 26 is less than 2λ, and $V_{sub}$ is between 1.07 times the surface wave velocity in the metal transducer 28 and 6,000 m/s. In some other embodiments, the guided SAW device 20 includes a $SiO_2$ dielectric layer between the support substrate 22 and the piezoelectric layer 26, the thickness ($t_{piezo}$) of the piezoelectric layer 26 is less than 2λ, and $V_{sub}$ is between 1.07 times the surface wave velocity in the metal transducer 28 and 5,400 m/s.

Figure 10:
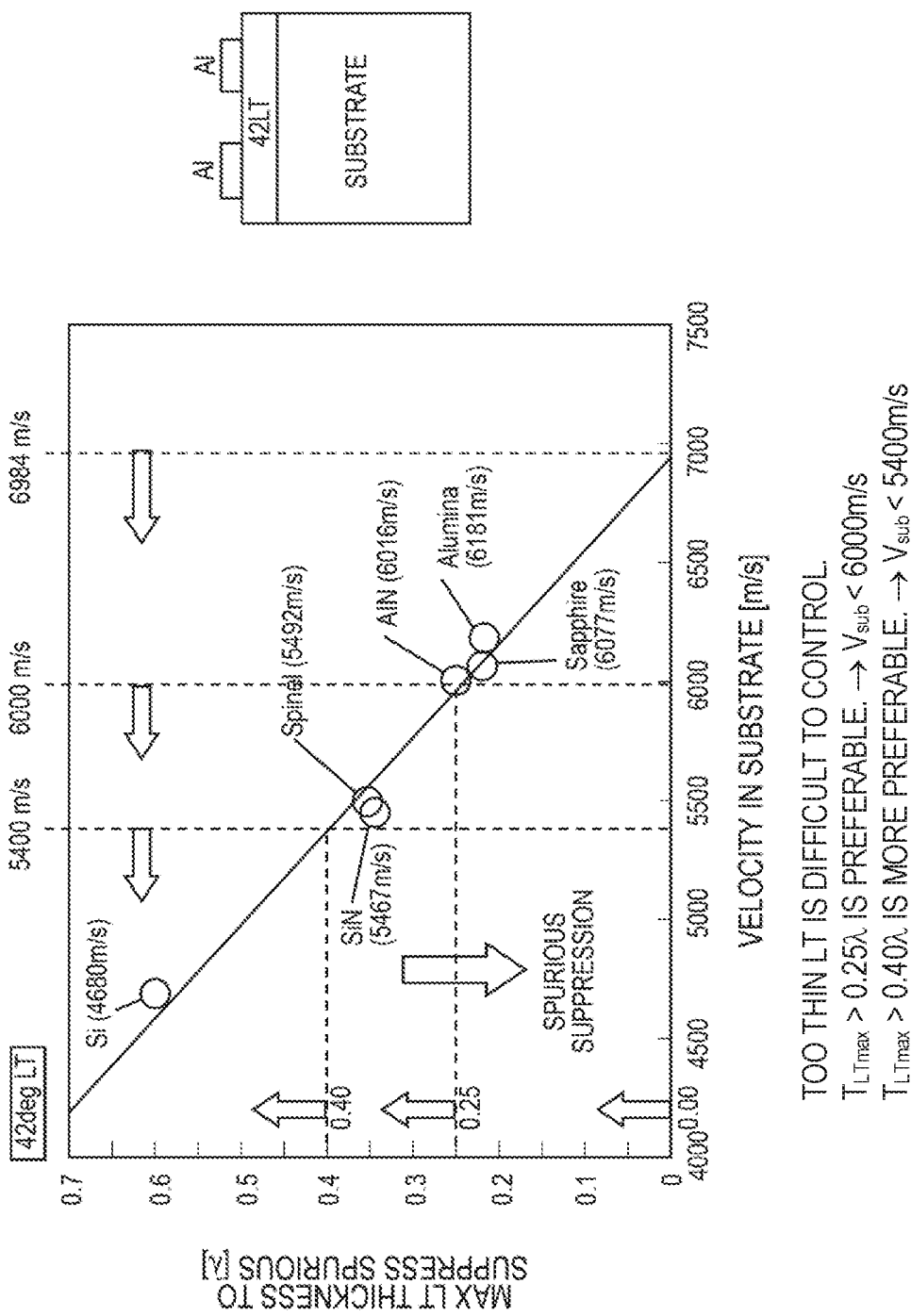
FIG. 10 illustrates the maximum LT thickness to provide spurious mode suppression for various substrate velocity when the piezoelectric layer is 42LT, according to some embodiments of the present disclosure.

In implementation, if the piezoelectric layer 26 is too thin, it is difficult to control piezoelectric layer thickness and uniformity over a wafer. As such, in some embodiments, the preferable thickness of the piezoelectric layer 26 is 0.25λ or more. As illustrated in FIG. 10, if the piezoelectric layer 26 is 42LT, then the velocity of the support substrate 22 needs to be less than or equal to 6,000 m/s to accept more than or equal to 0.25λ of the piezoelectric layer thickness. In some other embodiments, the more preferable thickness of the piezoelectric layer 26 is 0.4λ. As illustrated in FIG. 10, if the piezoelectric layer 26 is 42LT, then the velocity of the support substrate 22 needs to be less than or equal to 5,400 m/s to accept more than or equal to 0.4λ of the piezoelectric layer thickness. Thus, together with Equation (4), some example ranges for the thickness of the piezoelectric layer 26 when the piezoelectric layer 26 is LT are 0.25λ to the maximum thickness defined by Equation (4) in some embodiments and 0.4λ to the maximum thickness defined by Equation (4) in some other embodiments.

Figure 11:
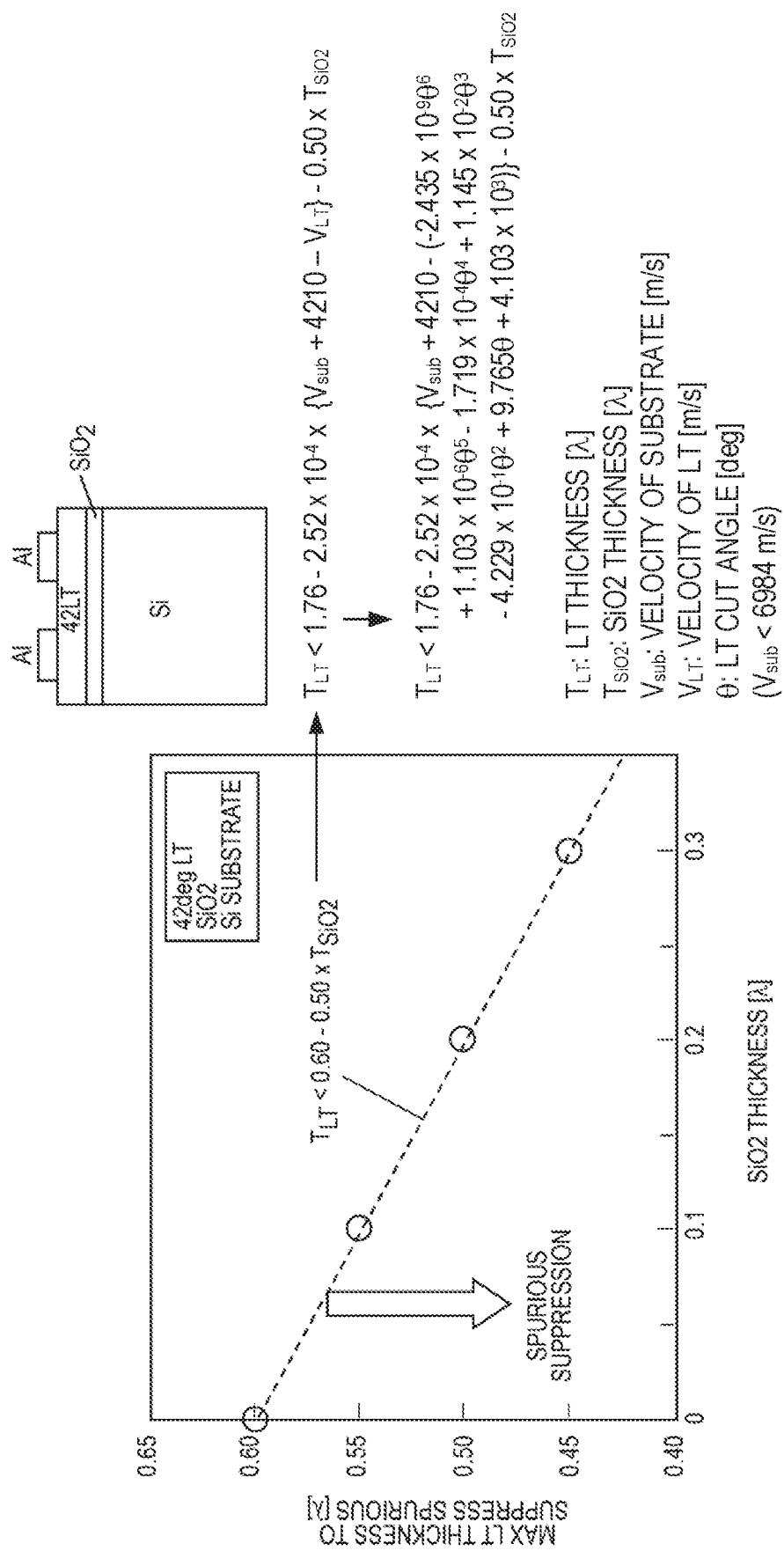
FIG. 11 shows simulation results for the relationship between Silicon Oxide thickness and the maximum LT thickness that provides spurious mode suppression.

The maximum thickness of the piezoelectric layer 26 defined by Equation (4) above is for LT and for when there is no dielectric layer(s) (e.g., no $SiO_2$) between the support substrate 22 and the piezoelectric layer 26. However, if a dielectric layer(s) such as $SiO_2$ is placed between the support substrate 22 and the piezoelectric layer 26, the resonance frequency of the guided SAW device 20 becomes lower due to the slower velocity of the dielectric layer(s). As such, a thinner piezoelectric layer 26 is needed for spurious mode suppression as compared to that needed when there is no dielectric layer(s) between the support substrate 22 and the piezoelectric layer 26. FIG. 11 shows simulation results for the relationship between $SiO_2$ thickness and the maximum LT thickness that provides spurious mode suppression for an example guided SAW device having an Si support substrate, an $SiO_2$ layer on the surface of the Si support substrate, and a 42LT piezoelectric layer on the surface of the $SiO_2$ layer opposite the Si support substrate. As shown, the relationship is linear. As such, Equations (3) and (4) can be modified to define the maximum thickness of the piezoelectric layer 26 when using LT and an $SiO_2$ dielectric layer between the support substrate 22 and the piezoelectric layer 26 as follows:

$$T_{LT} < 1.76 - 2.52 \times 10^{-4} \times (V_{sub} + 4210 - V_{LT}) - 0.50 \times T_{SiO2} \quad (5)$$

where $T_{SiO2}$ is the thickness of the $SiO_2$ dielectric layer in wavelengths. Note that for the more general case where the piezoelectric layer 26 can be LT or some other material (e.g., LN), Equation (5) becomes:

$$T_{piezo} < 1.76 - 2.52 \times 10^{-4} \times (V_{sub} + 4210 - V_{piezo}) - 0.50 \times T_{SiO2}$$

Substituting for $V_{LT}$ in Equation (5) gives:

$$T_{LT} < 1.76 - 2.52 \times 10^{-4} \times \{V_{sub} + 4210 - (-2.435 \times 10^{-9} \theta^6 + 1.103 \times 10^{-6} \theta^5 - 1.719 \times 10^{-4} \theta^4 + 1.145 \times 10^{-2} \theta^3 - 4.229 \times 10^{-1} \theta^2 + 9.765 \theta + 4.103 \times 10^3)\} - 0.50 \times T_{SiO2} \quad (6)$$

Thus, Equation (6) defines the maximum thickness of the piezoelectric layer 26 when using LT as the piezoelectric layer 26 and when including a $SiO_2$ dielectric layer between the support substrate 22 and the piezoelectric layer 26. Thus, in some embodiments of the guided SAW device 20, the piezoelectric layer 26 is rotated Y-cut LT having a thickness that is less than the maximum thickness defined in Equation (6). In some embodiments, the thickness of the piezoelectric layer 26 is between 0.05λ and the maximum thickness defined in Equation (6). In other embodiments, the thickness of the piezoelectric layer 26 is between 0.1λ and the maximum thickness defined in Equation (6). In other embodiments, the thickness of the piezoelectric layer 26 is between 0.25λ and the maximum thickness defined in Equation (6). In other embodiments, the thickness of the piezoelectric layer 26 is between 0.4λ and the maximum thickness defined in Equation (6).

Note that while Equation (6) is derived for LT and $SiO_2$, the maximum thickness of the piezoelectric layer 26 that provides spurious mode suppression may be derived in the same manner for other dielectric materials and/or other piezoelectric materials. The use of LT and $SiO_2$ is only an example. Fluorine (F) or other atom-doped $SiO_2$ may be used for the layer(s) between the piezoelectric layer 26 and the support substrate 22 as well as for the passivation layer(s). Further note that Equation (6) remains valid whether the $SiO_2$ is doped with F or some other atom.

Figure 12A:
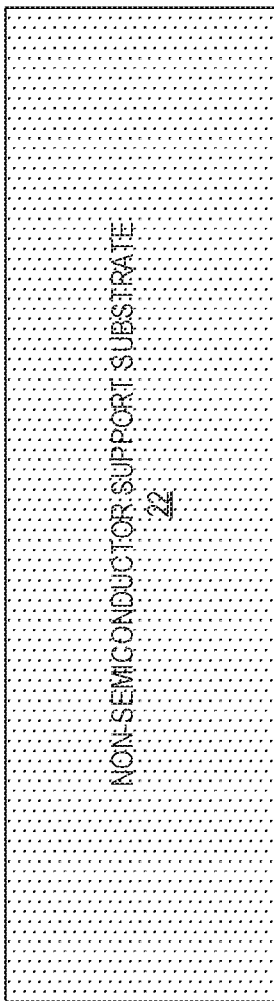
FIGS. 12A through 12G illustrate a process for fabricating the guided SAW device of FIG. 4 according to some embodiments of the present disclosure.
Figure 12B:
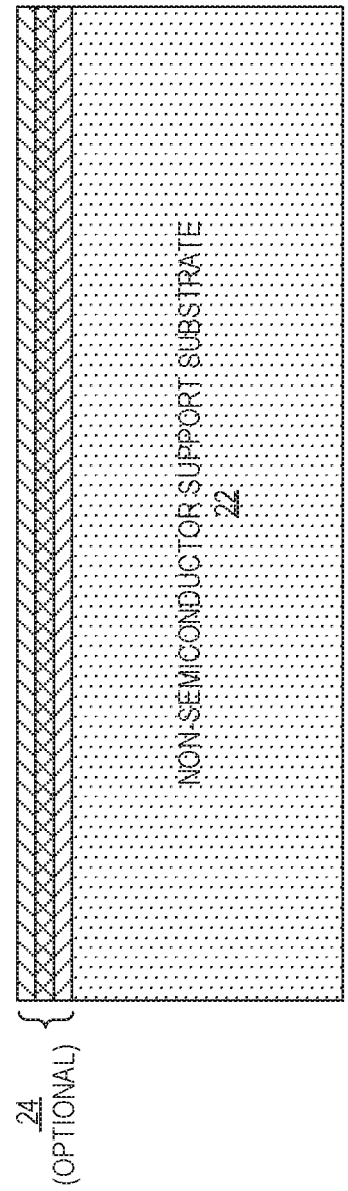
Figure 12C:
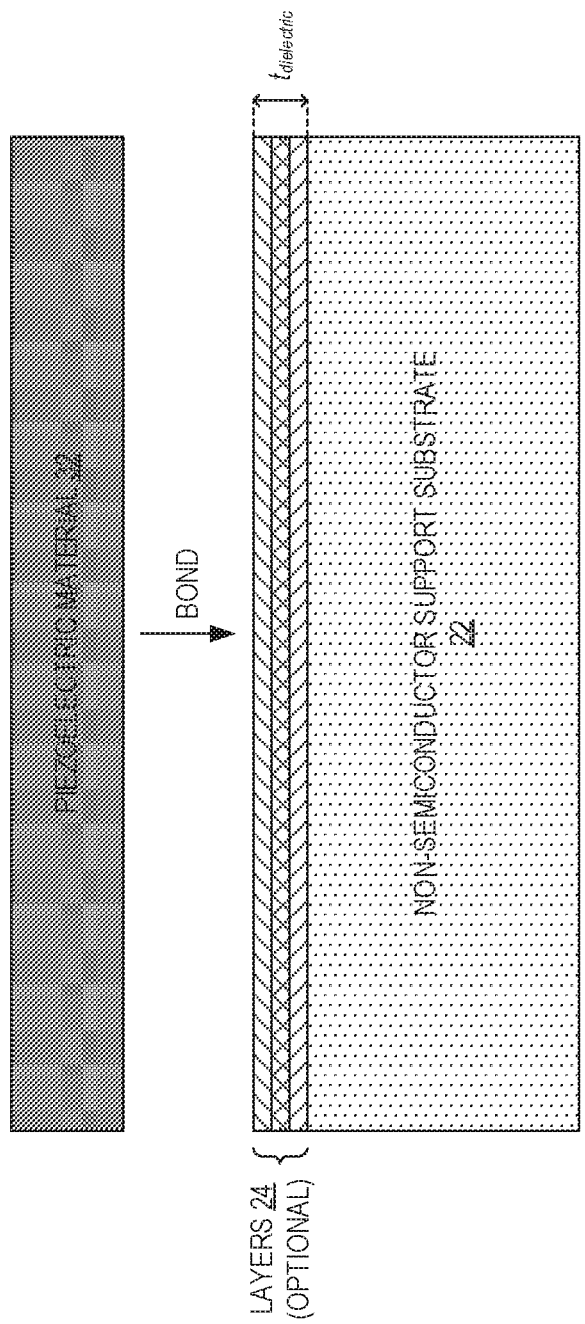
Figure 12D:
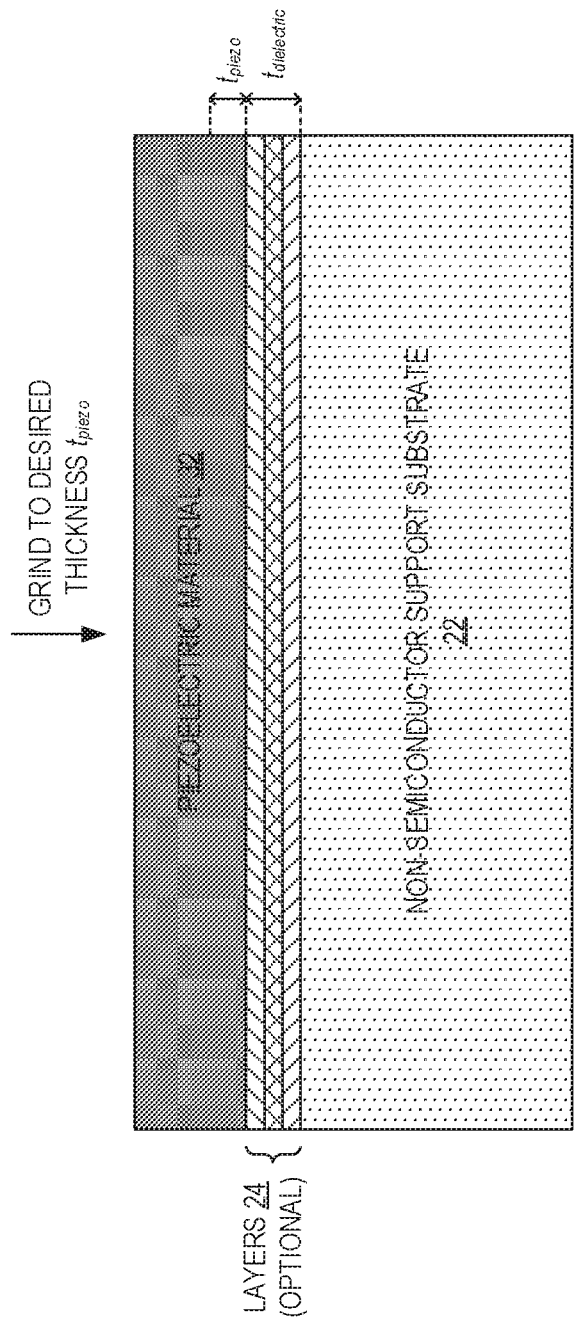
Figure 12E:
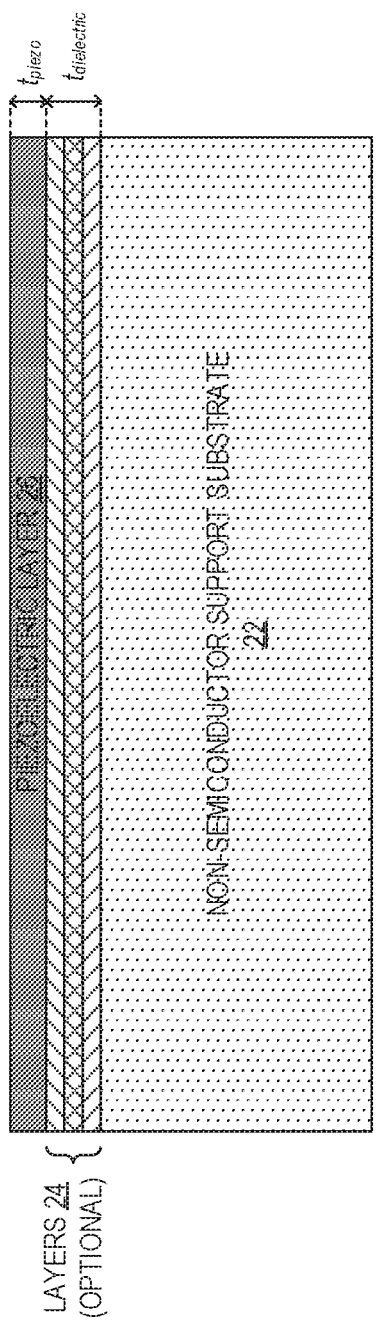

FIGS. 12A through 12G illustrate a process for fabricating the guided SAW device 20 of FIG. 4 according to some embodiments of the present disclosure. As illustrated in FIG. 12A, the process starts with the support substrate 22. As illustrated in FIG. 12B, the one or more additional layers 24 (e.g., one or more dielectric layers) are formed (e.g., deposited or bonded) on the surface of the support substrate 22. Again, the additional layer(s) 14 are optional. A piezoelectric material 32 is bonded on the surface of the additional layer(s) 14 opposite the support substrate 22 (or on the surface of the support substrate 22 if the additional layer(s) 14 are not present), as illustrated in FIG. 12C. As illustrated in FIG. 12D, the piezoelectric material 32 is grinded or otherwise processed to form the piezoelectric layer 26 having the desired thickness ($t_{piezo}$). The resulting structure is illustrated in FIG. 12E. As discussed above, in some embodiments, the thickness of the piezoelectric layer 26 is selected as a function of both the velocity of the support substrate 22 and the velocity of the piezoelectric material 32 to provide spurious mode suppression. If layers are used between the support substrate 22 and the piezoelectric material 32, they can alternatively be formed on the surface of the piezoelectric material 32 instead of on the support substrate 22 and the bonding can be made between the layers and the support substrate 22. It is also possible to form some of the layers on the support substrate 22 and some of the layers on the piezoelectric material 32 and to realize the bonding of the layers.

Figure 12F:
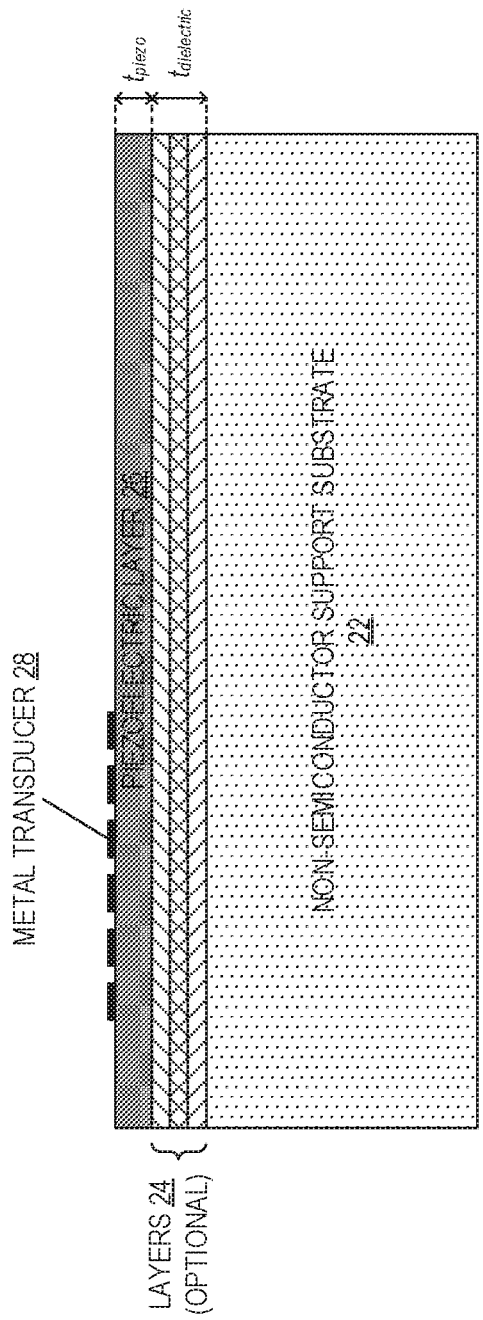
Figure 12G:
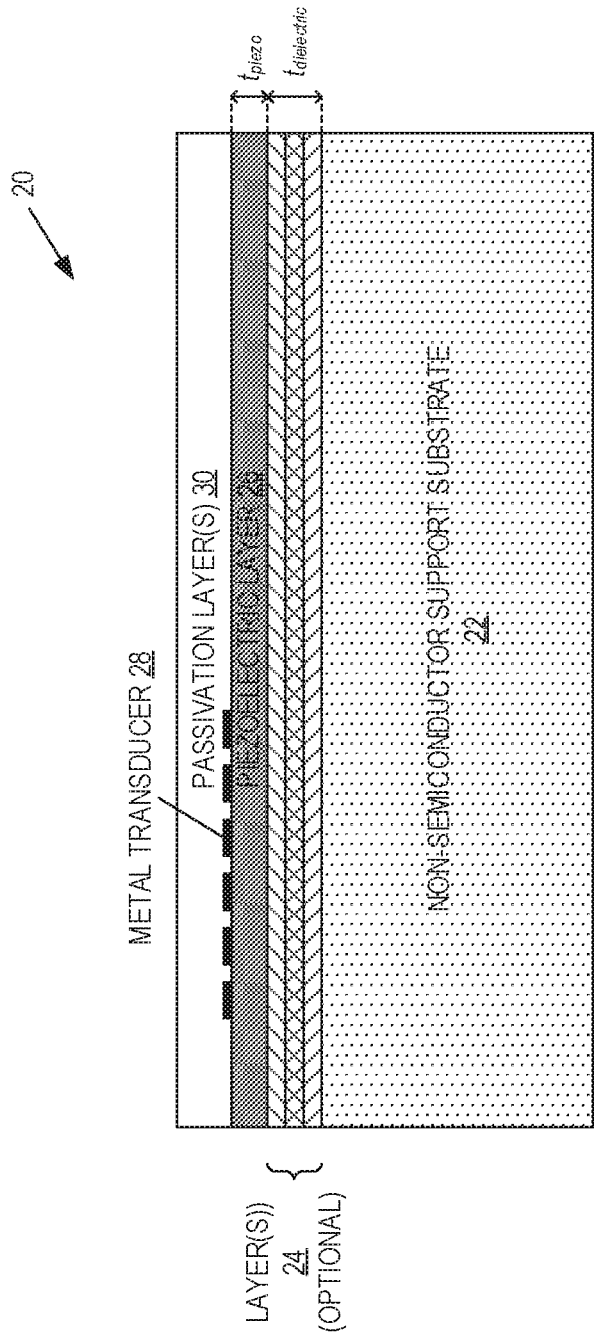

The metal transducer 28 is then formed on (e.g., directly on) the surface of the piezoelectric layer 26 opposite the additional layer(s) 14 (if present) and the support substrate 22, as illustrated in FIG. 12F. Optionally, the one or more passivation layers 30 are then formed (e.g., deposited) on the surface of the metal transducer 28 and the exposed surface of the underlying layers, as illustrated in FIG. 12G.

Figure 13A:
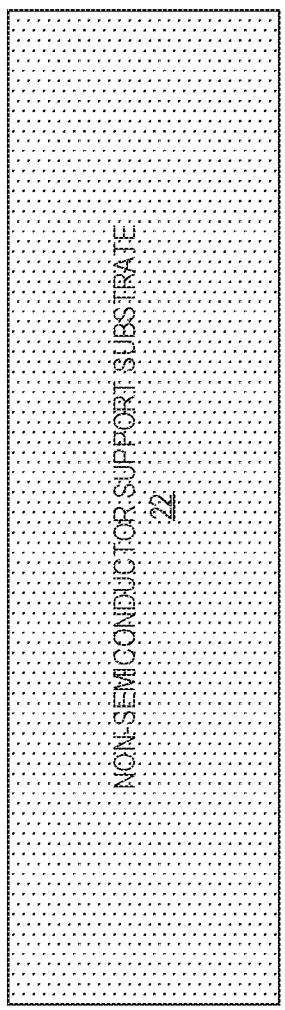
Figure 13B:
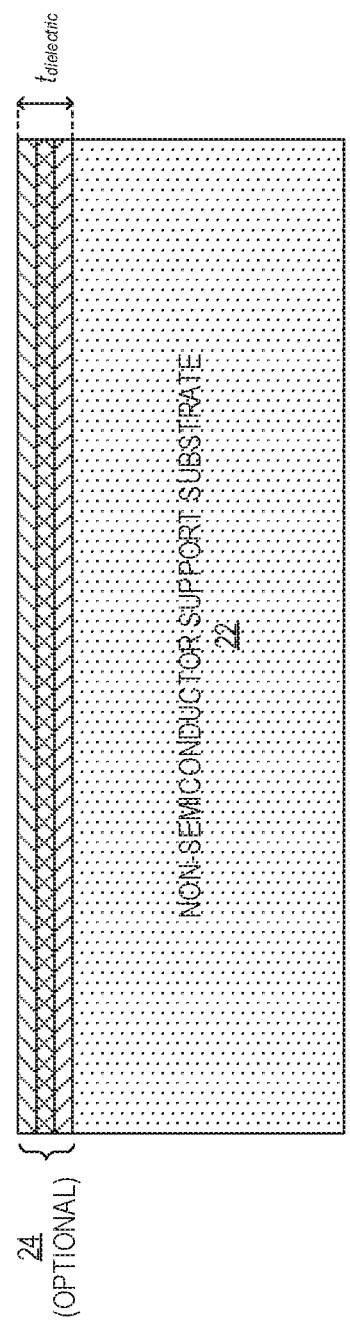
Figure 13C:
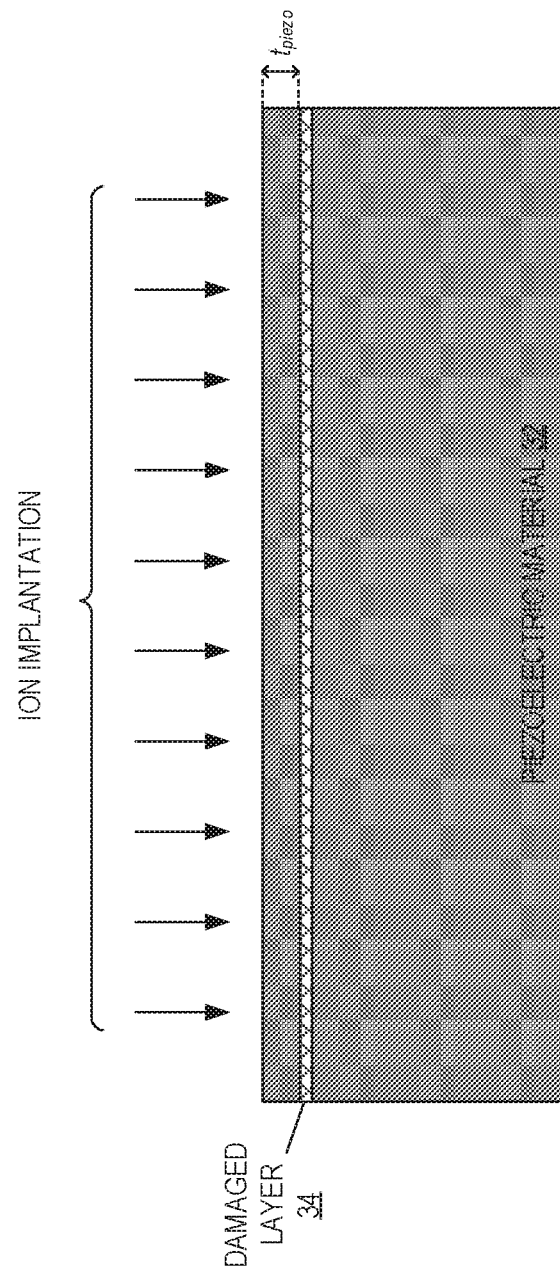
Figure 13D:
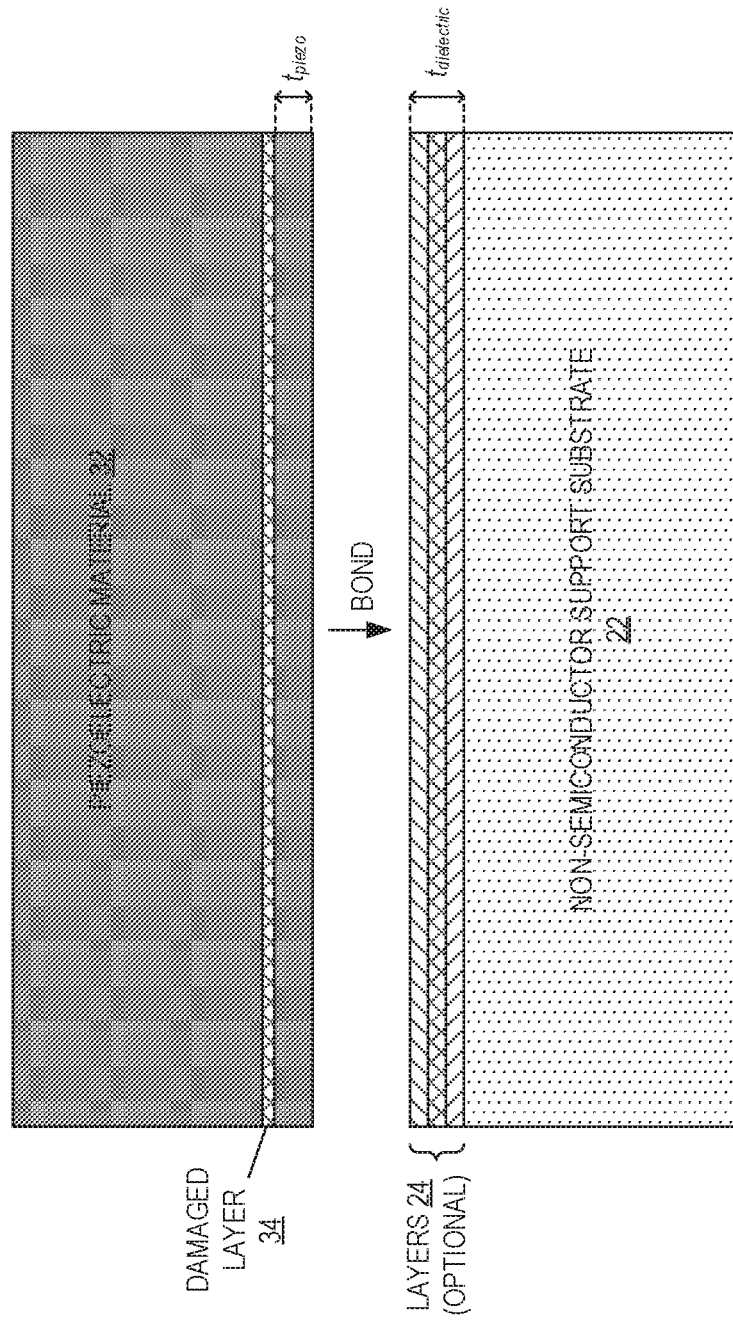
Figure 13E:
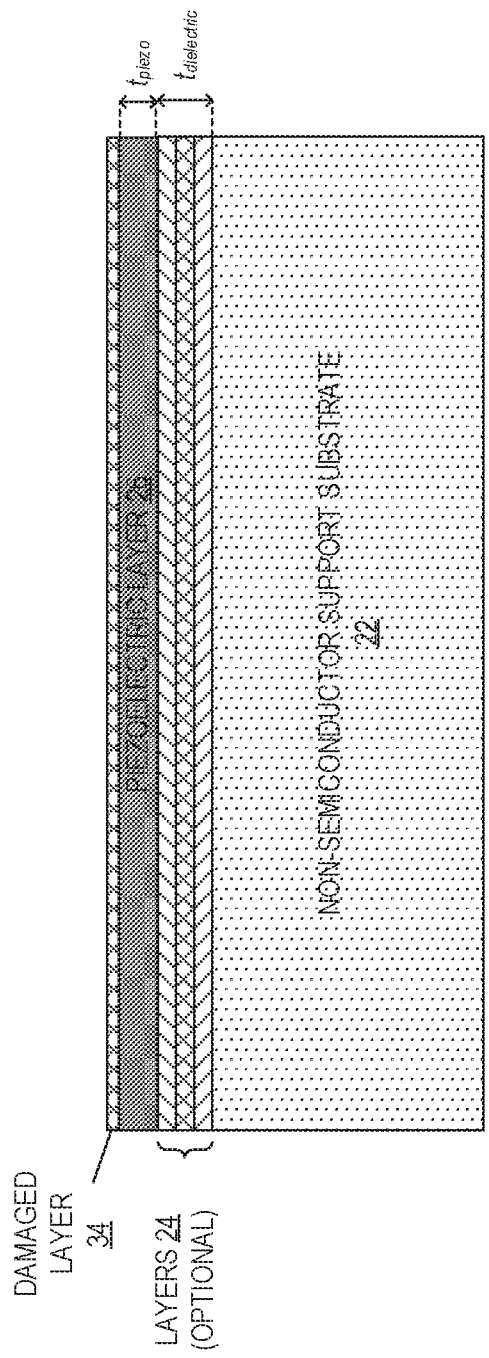

FIGS. 13A through 13H illustrate a process for fabricating the guided SAW device 20 of FIG. 4 according to some other embodiments of the present disclosure. As illustrated in FIG. 13A, the process starts with the support substrate 22. As illustrated in FIG. 13B, the one or more additional layers 24 (e.g., one or more dielectric layers) are formed (e.g., deposited or bonded) on the surface of the support substrate 22. Again, the additional layer(s) 14 are optional. Ion implantation into the surface of a piezoelectric material 32, as illustrated in FIG. 13C, is used to create a damaged layer 34 within the piezoelectric material 32 at a desired, or controlled, depth that defines the desired thickness of the piezoelectric layer 26. The piezoelectric material 32 is bonded on the surface of the additional layer(s) 14 opposite the support substrate 22 (or on the surface of the support substrate 22 if the additional layer(s) 14 are not present), as illustrated in FIG. 13D. As illustrated in FIGS. 13E and 13F, the portion of the piezoelectric material 32 above the damaged layer 34 is removed to thereby form the piezoelectric layer 26 having the desired thickness ($t_{piezo}$). Notably, the surface of the piezoelectric layer 26 is preferably polished to remove any defects remaining on the surface of the piezoelectric layer 26. The resulting structure is illustrated in FIG. 13F. As discussed above, in some embodiments, the thickness of the piezoelectric layer 26 is selected as a function of both the velocity of the support substrate 22 and the velocity of the piezoelectric material 26 to provide spurious mode suppression. As discussed above, the layers can be deposited on the support substrate 22, on the piezoelectric material 26, or partly on both.

Figure 13G:
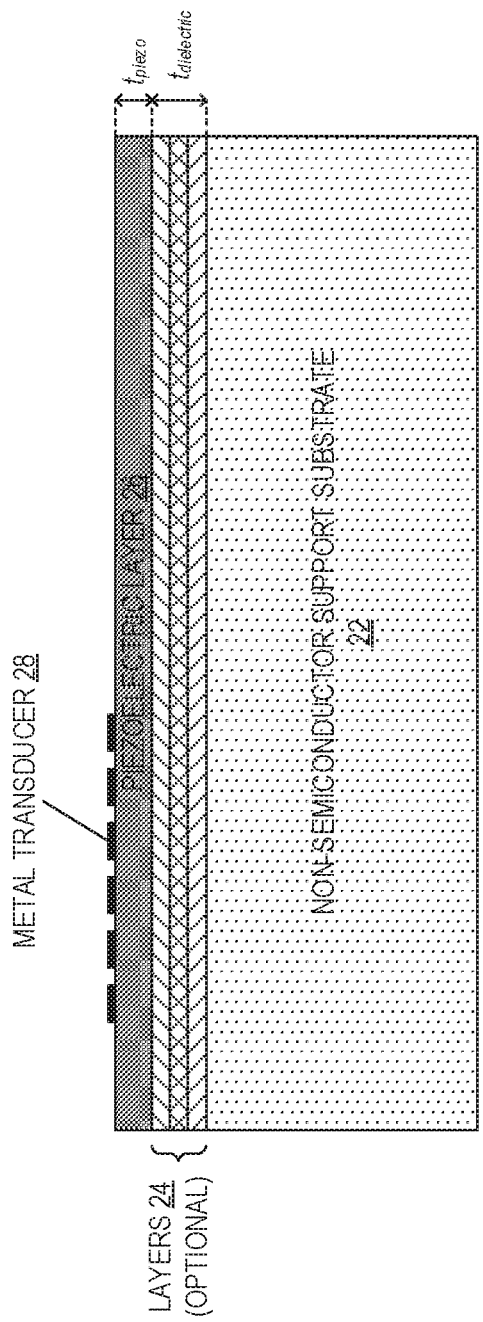
Figure 13H:
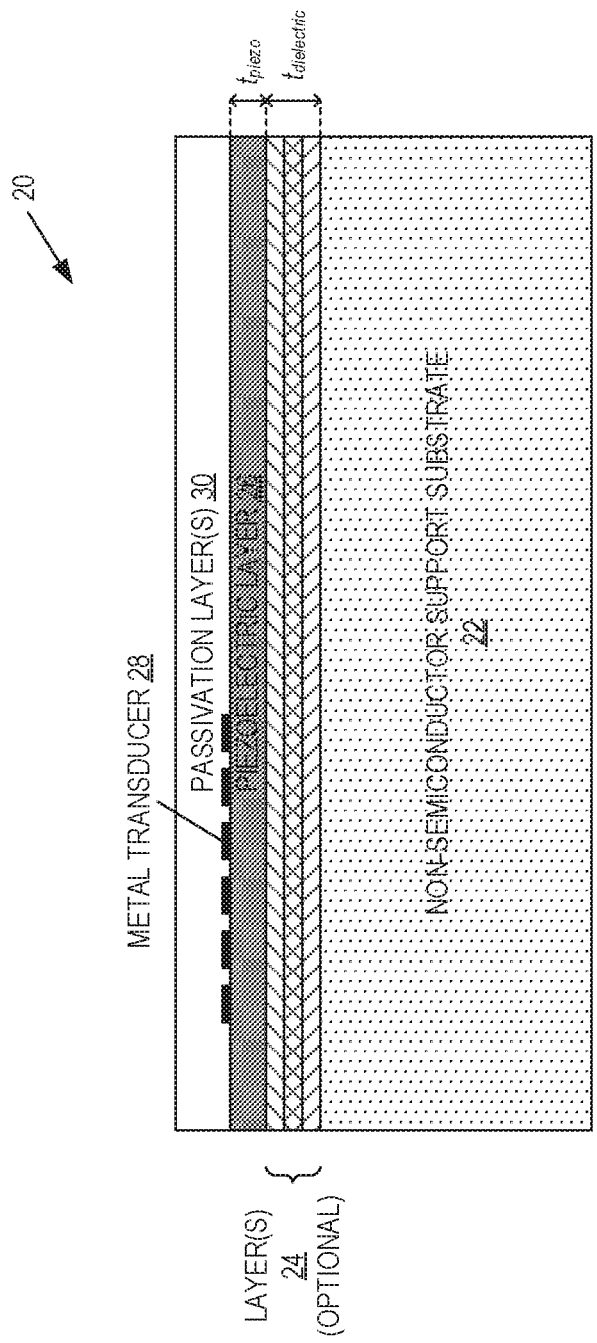

The metal transducer 28 is then formed on (e.g., directly on) the surface of the piezoelectric layer 26 opposite the additional layer(s) 14 (if present) and the support substrate 22, as illustrated in FIG. 13G. Optionally, the one or more passivation layers 30 are then formed (e.g., deposited) on the surface of the metal transducer 28 and the exposed surface of the underlying layers, as illustrated in FIG. 13H.

The present disclosure provides for, but is not limited to, the following:

A Surface Acoustic Wave (SAW) device without Silicon Dioxide ($SiO_2$) on a piezoelectric/non-semiconductor substrate, wherein the piezoelectric thickness is less than 2 lambdas ($\lambda$) and bulk wave cutoff frequency is more than fa+(fa−fr)/2 and $V_{sub}$ is less than 6,984 meters per second (m/s); or on a piezoelectric/non-semiconductor substrate, wherein the piezoelectric thickness is less than $2\lambda$ and bulk wave cutoff frequency is more than fa+(fa−fr)/2 and $V_{sub}$ is less than 6,000 m/s; or on a piezoelectric/non-semiconductor substrate, wherein the piezoelectric thickness is less than $2\lambda$ and bulk wave cutoff frequency is more than fa+(fa−fr)/2 and $V_{sub}$ is less than 5,400 m/s; or on a piezoelectric/non-semiconductor substrate, wherein the piezoelectric thickness is less than $2\lambda$ and $V_{sub}$ is between 1.07 times the surface wave velocity in the Interdigitated Transducer (IDT) and 6,984 m/s; or on a piezoelectric/non-semiconductor substrate, wherein the piezoelectric thickness is less than $2\lambda$ and $V_{sub}$ is between 1.07 times the surface wave velocity in the IDT and 6,000 m/s; or on a piezoelectric/non-semiconductor substrate, wherein the piezoelectric thickness is less than $2\lambda$ and $V_{sub}$ is between 1.07 times the surface wave velocity in the IDT and 5,400 m/s wherein the piezoelectric material is Lithium Tantalate ($LiTaO_3$; LT) or Lithium Niobate ($LiNbO_3$)

wherein the piezoelectric material is rotated Y-cut LT and LT thickness is less than 1.76−2.52e−4×{Vsub+4210− (−2.435e−9 $\theta^6$+1.103e−6 $\theta^5$−1.719e−4 $\theta^4$+1.145e−2 $\theta^3$−4.229e−1 $\theta^2$+9.765 $\theta$+4.103e+3)} (in $\lambda$), where $V_{sub}$ is the velocity in the substrate (in meters per second (m/s)), and $\theta$ is the LT cut-angle (in degrees)

wherein the piezoelectric thickness is greater than $0.10\lambda$.

A Surface Acoustic Wave (SAW) device with Silicon Dioxide ($SiO_2$) on a piezoelectric/$SiO_2$/non-semiconductor substrate, wherein the piezoelectric thickness is less than 2 lambdas ($\lambda$) and bulk wave cutoff frequency is more than fa+(fa−fr)/2 and $V_{sub}$ is less than 6,984 m/s; or on a piezoelectric/$SiO_2$/non-semiconductor substrate, wherein the piezoelectric thickness is less than $2\lambda$ and bulk wave cutoff frequency is more than fa+(fa−fr)/2 and $V_{sub}$ is less than 6,000 m/s; or on a piezoelectric/$SiO_2$/non-semiconductor substrate, wherein the piezoelectric thickness is less than $2\lambda$ and bulk wave cutoff frequency is more than fa+(fa−fr)/2 and $V_{sub}$ is less than 5,400 m/s; or on a piezoelectric/$SiO_2$/non-semiconductor substrate, wherein the piezoelectric thickness is less than $2\lambda$ and $V_{sub}$ is between 1.07 times the surface wave velocity in the Interdigital Transducer (IDT) and 6,984 m/s; or on a piezoelectric/$SiO_2$/non-semiconductor substrate, wherein the piezoelectric thickness is less than $2\lambda$ and $V_{sub}$ is between 1.07 times the surface wave velocity in the IDT and 6,000 m/s; or on a piezoelectric/$SiO_2$/non-semiconductor substrate, wherein the piezoelectric thickness is less than $2\lambda$ and $V_{sub}$ is between 1.07 times the surface wave velocity in the IDT and 5,400 m/s wherein the piezoelectric material is Lithium Tantalate ($LiTaO_3$; LT) or Lithium Niobate ($LiNbO_3$)

wherein the piezoelectric material is rotated Y-cut LT and LT thickness is less than 1.76−2.52e−4×{Vsub+4210− (−2.435e−9 $\theta^6$+1.103e−6 $\theta^5$−1.719e−4 $\theta^4$+1.145e−2 $\theta^3$−4.229e−1 $\theta^2$+9.765 $\theta$+4.103e+3)}−0.50×$TSiO_2$ (in $\lambda$), where Vsub is the velocity in substrate (in meters per second (m/s)), $\theta$ is the LT cut-angle (in degrees), and $TSiO_2$ is the $SiO_2$ thickness (in $\lambda$)

wherein the piezoelectric thickness is greater than $0.05\lambda$ wherein the $SiO_2$ thickness less than $0.1\lambda$ wherein the piezoelectric layer is single crystal (not deposited film)

wherein the non-semiconductor substrate is made from wafer (not deposited film).

A SAW filter or a SAW duplexer on the substrate.

Those skilled in the art will recognize improvements and modifications to the preferred embodiments of the present disclosure. All such improvements and modifications are considered within the scope of the concepts disclosed herein and the claims that follow.

What is claimed is:

1. A Surface Acoustic Wave (SAW) device, comprising:
a non-semiconductor support substrate;
a piezoelectric layer on a surface of the non-semiconductor support substrate; and
at least one Interdigitated Transducer (IDT) on a surface of the piezoelectric layer opposite the non-semiconductor support substrate, wherein a thickness of the piezoelectric layer is less than two times $\lambda$, where $\lambda$ is a wavelength of a resonance frequency of the SAW device, and a bulk wave cut-off frequency of the SAW device is greater than fa+(fa−fr)/2, where fr is the resonance frequency of the SAW device and fa is an anti-resonance frequency of the SAW device.

2. The SAW device of claim 1 wherein the piezoelectric layer comprises Lithium Tantalate.

3. The SAW device of claim 1 wherein the piezoelectric layer comprises Lithium Niobate.

4. The SAW device of claim 1 wherein a velocity of a slowest acoustic mode in a propagation direction of the non-semiconductor support substrate is less than 6,984 meters per second.

5. The SAW device of claim 1 wherein a velocity of a slowest acoustic mode in a propagation direction of the non-semiconductor support substrate is less than 6,000 meters per second.

6. The SAW device of claim 1 wherein a velocity of a slowest acoustic mode in a propagation direction of the non-semiconductor support substrate is less than 5,400 meters per second.

7. The SAW device of claim 1 wherein the piezoelectric layer is single crystal.

8. The SAW device of claim 1 wherein the non-semiconductor substrate is made from a wafer.

9. A Surface Acoustic Wave (SAW) device, comprising:
a non-semiconductor support substrate;
a piezoelectric layer on a surface of the non-semiconductor support substrate; and
at least one Interdigitated Transducer (IDT) on a surface of the piezoelectric layer opposite the non-semiconductor support substrate, wherein a thickness of the piezoelectric layer is less than two times $\lambda$, where $\lambda$ is a wavelength of a resonance frequency of the SAW device, and a velocity of a slowest acoustic mode in a propagation direction of the non-semiconductor support substrate is between 1.07 times a surface wave velocity in the at least one IDT and 6,984 meters per second.

10. The SAW device of claim 9 wherein the velocity of the slowest acoustic mode in the propagation direction of the non-semiconductor support substrate is between 1.07 times the surface wave velocity in the at least one IDT and 6,000 meters per second.

11. The SAW device of claim 9 wherein the velocity of the slowest acoustic mode in the propagation direction of the non-semiconductor support substrate is between 1.07 times the surface wave velocity in the at least one IDT and 5,400 meters per second.

12. The SAW device of claim 9 wherein the piezoelectric layer is single crystal.

13. The SAW device of claim 9 wherein the non-semiconductor support substrate is made from a wafer.

14. A Surface Acoustic Wave (SAW) device, comprising:
a non-semiconductor support substrate;
a piezoelectric layer on a surface of the non-semiconductor support substrate; and
at least one Interdigitated Transducer (IDT) on a surface of the piezoelectric layer opposite the non-semiconductor support substrate, wherein a thickness of the piezoelectric layer is less than a defined maximum thickness of the piezoelectric layer that supports spurious mode suppression, the defined maximum thickness of the piezoelectric layer being a function of both a SAW velocity of the piezoelectric layer and a velocity of a slowest acoustic mode in a propagation direction of the non-semiconductor support substrate.

15. The SAW device of claim 14 wherein:
there are no dielectric layers between the non-semiconductor support substrate and the piezoelectric layer; and the defined maximum thickness of the piezoelectric layer is, in units of $\lambda$, $1.76-2.52\times10^{-4}\times(V_{sub}+4210-V_{piezo})$, where $V_{sub}$ is the velocity of the slowest acoustic mode in the propagation direction of the non-semiconductor support substrate and $V_{piezo}$ is the SAW velocity of the piezoelectric layer in units of meters per second.

16. The SAW device of claim 15 wherein the thickness of the piezoelectric layer is greater than 0.05 times $\lambda$, where $\lambda$ is a wavelength of a resonance frequency of the SAW device, and the velocity of the slowest acoustic mode in the propagation direction of the non-semiconductor support substrate is less than 6,984 meters per second.

17. The SAW device of claim 15 wherein the thickness of the piezoelectric layer is greater than 0.1 times $\lambda$, where $\lambda$ is the wavelength of the resonance frequency of the SAW device, and the velocity of the slowest acoustic mode in the propagation direction of the non-semiconductor support substrate is less than 6,984 meters per second.

18. The SAW device of claim 15 wherein the velocity of the slowest acoustic mode in the propagation direction of the non-semiconductor support substrate is less than 6,000 meters per second.

19. The SAW device of claim 15 wherein the velocity of the slowest acoustic mode in the propagation direction of the non-semiconductor support substrate is less than 5,400 meters per second.

20. The SAW device of claim 14 wherein:
there are no dielectric layers between the non-semiconductor support substrate and the piezoelectric layer;
the piezoelectric layer comprises rotated Y-cut, X propagation Lithium Tantalate (LT); and
the defined maximum thickness of the piezoelectric layer is, in units of $\lambda$, $1.76-2.52\times10^{-4}\times(V_{sub}+4210-(-2.435\times10^{-9}\theta^6+1.103\times10^{-6}\theta^5-1.719\times10^{-4}\theta^4+1.145\times10^{-2}\theta^3-4.229\times10^{-1}\theta^2+9.765\theta+4.103\times10^3))$, where $V_{sub}$ is the velocity of the slowest acoustic mode in the propagation direction of the non-semiconductor support substrate in units of meters per second and $\theta$ is a cut-angle of the rotated Y-cut, X propagation LT in units of degrees.

21. The SAW device of claim 14 further comprising a Silicon Oxide dielectric layer between the non-semiconductor support substrate and the piezoelectric layer, wherein:
the defined maximum thickness of the piezoelectric layer is, in units of $\lambda$, $1.76-2.52\times10^{-4}\times(V_{sub}+4210-V_{piezo})-0.50\times T_{SiO2}$, where $V_{sub}$ is the velocity of the slowest acoustic mode in the propagation direction of the non-semiconductor support substrate in units of meters per second and $V_{piezo}$ is the SAW velocity of the piezoelectric substrate in units of meters per second and $T_{SiO2}$ is the thickness of the Silicon Oxide dielectric layer in units of wavelength $\lambda$.

22. The SAW device of claim 21 wherein the thickness of the piezoelectric layer is greater than 0.05 times $\lambda$, where $\lambda$ is a wavelength of a resonance frequency of the SAW device, and the velocity of the slowest acoustic mode in the propagation direction of the non-semiconductor support substrate is less than 6,984 meters per second.

23. The SAW device of claim 21 wherein the thickness of the piezoelectric layer is greater than 0.1 times $\lambda$, where $\lambda$ is a wavelength of a resonance frequency of the SAW device, and the velocity of the slowest acoustic mode in the propagation direction of the non-semiconductor support substrate is less than 6,984 meters per second.

24. The SAW device of claim 21 wherein the velocity of the slowest acoustic mode in the propagation direction of the non-semiconductor support substrate is less than 6,000 meters per second.

25. The SAW device of claim 21 wherein the velocity of the slowest acoustic mode in the propagation direction of the non-semiconductor support substrate is less than 5,400 meters per second.

26. The SAW device of claim 14 further comprising a Silicon Oxide dielectric layer between the non-semiconductor support substrate and the piezoelectric layer, wherein:
the piezoelectric layer comprises rotated Y-cut, X propagation Lithium Tantalate (LT); and
the defined maximum thickness of the piezoelectric layer is, in units of $\lambda$, $1.76-2.52\times10^{-4}\times\{V_{sub}+4210-(-2.435\times10^{-9}\theta^6+1.103\times10^{-6}\theta^5-1.719\times10^{-4}\theta^4+1.145\times10^{-2}\theta^3-4.229\times10^{-1}\theta^2+9.765\theta+4.103\times10^3)\}-0.50\times T_{SiO2}$, where $V_{sub}$ is the velocity of the slowest acoustic mode in the propagation direction of the non-semiconductor support substrate in units of meters per second, $\theta$ is a cut-angle of the rotated Y-cut, X propagation LT in units of degrees, and $T_{SiO2}$ is a thickness of the Silicon Oxide dielectric layer in units of wavelength $\lambda$.

27. The SAW device of claim 14 further comprising a Silicon Oxide dielectric layer between the non-semiconductor support substrate and the piezoelectric layer, wherein a thickness of the Silicon Oxide dielectric layer is less than 0.1 times $\lambda$, where $\lambda$ is a wavelength of a resonance frequency of the SAW device.

28. The SAW device of claim 14 wherein the piezoelectric layer is single crystal.

29. The SAW device of claim 14 wherein the non-semiconductor support substrate is made from a wafer.

* * * * *